(12) United States Patent
Akahane

(10) Patent No.: US 8,351,235 B2
(45) Date of Patent: Jan. 8, 2013

(54) LEVEL SHIFT CIRCUIT

(75) Inventor: Masashi Akahane, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 210 days.

(21) Appl. No.: 12/926,500

(22) Filed: Nov. 23, 2010

(65) Prior Publication Data
US 2011/0134710 A1 Jun. 9, 2011

(30) Foreign Application Priority Data

Dec. 4, 2009 (JP) ................................. 2009-276806
Jun. 24, 2010 (JP) ................................. 2010-143826

(51) Int. Cl.
*G11C 19/00* (2006.01)
(52) U.S. Cl. .......................................... 365/81; 365/80
(58) Field of Classification Search .................... 365/81; 327/381
See application file for complete search history.

(56) References Cited

U.S. PATENT DOCUMENTS 5,917,359 A * 6/1999 Fukunaga et al. ............ 327/381
7,746,148 B2 * 6/2010 Hsu ................................ 327/333

FOREIGN PATENT DOCUMENTS

JP H09-172366 6/1997

* cited by examiner

*Primary Examiner* — Anthan Tran
(74) *Attorney, Agent, or Firm* — Manabu Kanesaka

(57) ABSTRACT

A feedback circuit by which an output of a memory device for storing level-shifted data can be fed back to the input side includes inverters, resistors, and transistors. The resistance value of combined resistance for pulling up or down first and second switching devices is varied in accordance with the output of the memory device by the feedback circuit, so that malfunction caused by dv/dt noise can be dealt with out generating any through current. In this manner, it is possible to provide a level shift circuit which can deal with malfunction causing dv/dt noise regardless of an on or off state of a high-potential-side switching device, while generation of a through current can be suppressed.

22 Claims, 26 Drawing Sheets

Fig. 5
<SH:Low、dV/: Small>
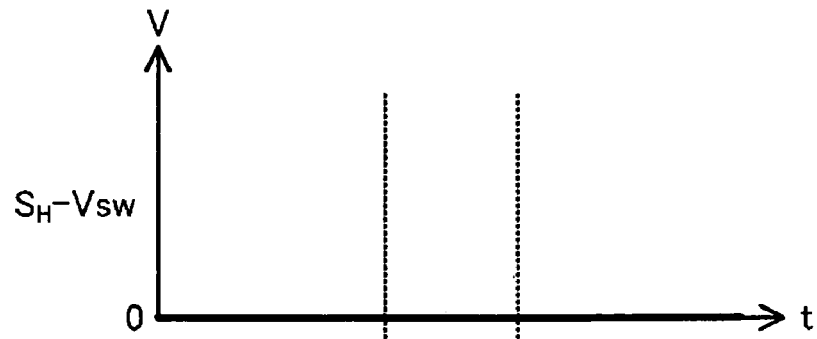
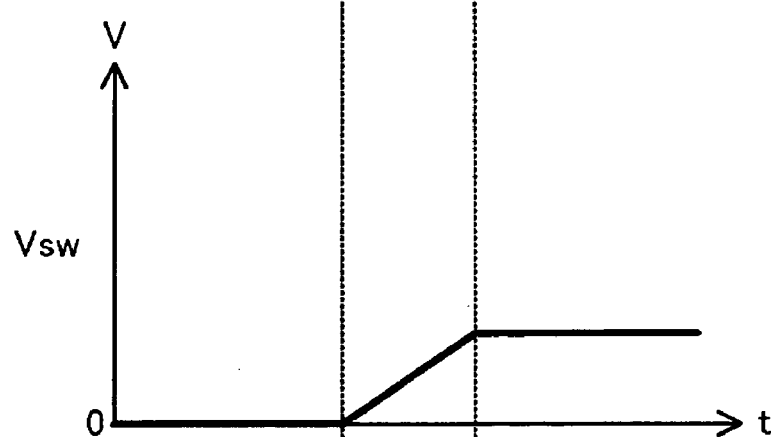
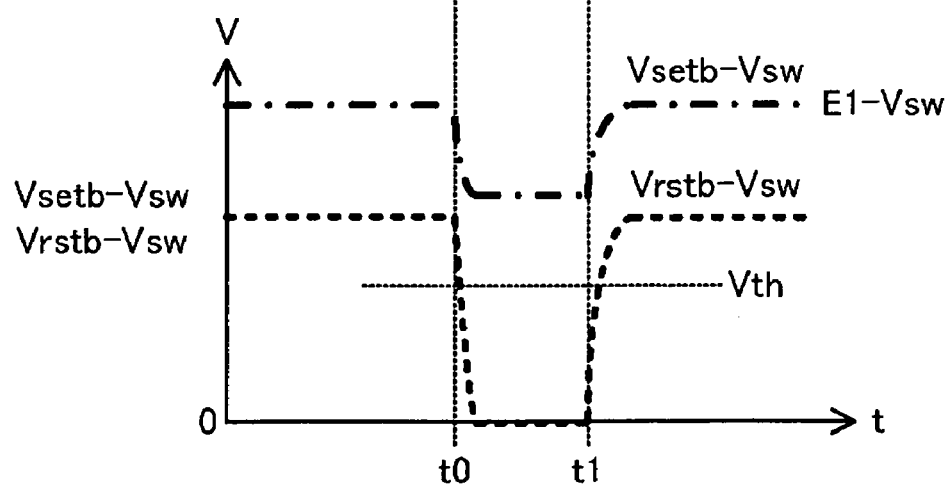

Fig. 6
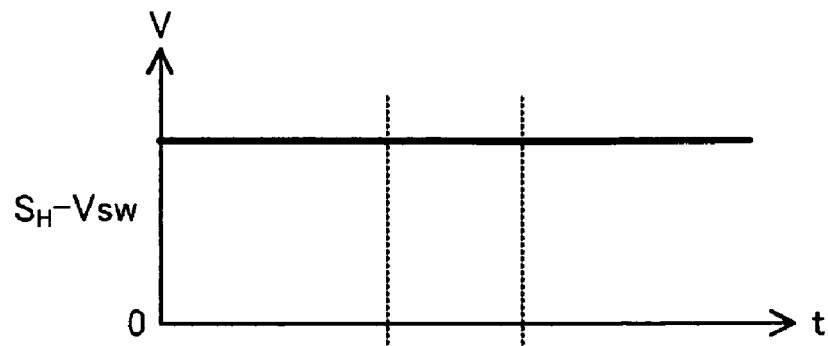
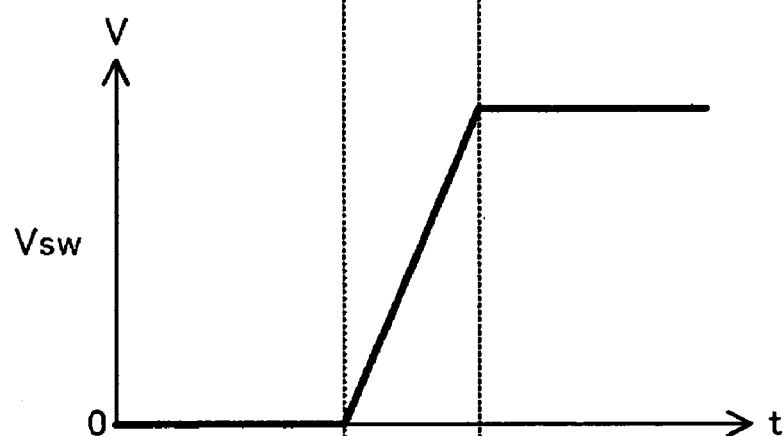
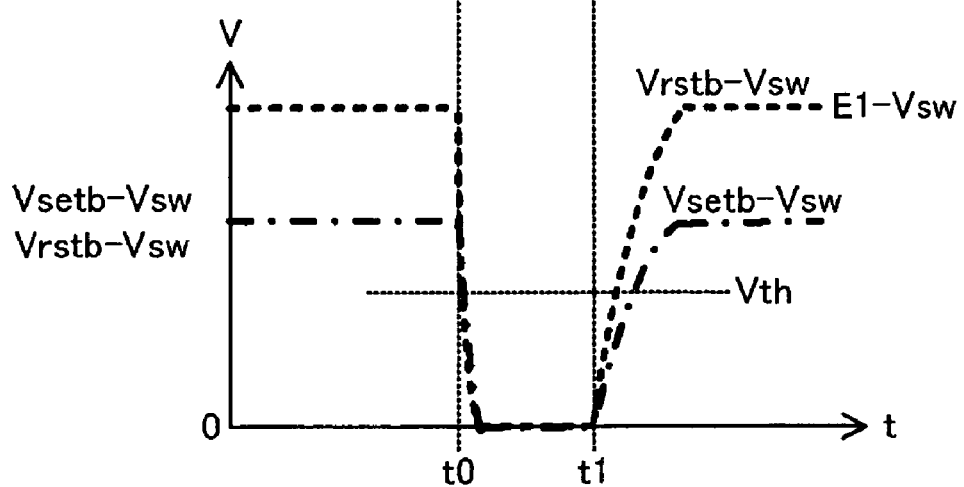

LEVEL SHIFT CIRCUIT

BACKGROUND OF THE INVENTION AND RELATED ART STATEMENT

The present invention relates to a level shift circuit for transmitting a signal to a secondary-side system operating with operating potential different from operating potential on the primary side which is the input side.

For example, in a half-bridge circuit in which switching devices are connected in series and which is driven by a high-potential-system power source, a level shift circuit is used for driving high-potential-side switching devices with a low-potential-system signal.

FIG. 19 is a diagram showing a configuration example of a half-bridge circuit using a level shift circuit in the background art. In FIG. 19, the reference numeral 100 represents an output circuit in which switching devices SWL and SWH are connected in series, and to which power is supplied from a high-voltage power source Ein. The switching device SWL is a low-potential-side switching device, which is, for example, an N-channel MOS transistor or an N-type IGBT (Insulated Gate Bipolar Transistor). The switching device SWH is a high-potential-side switching device, which is, for example, an N-channel or P-channel MOS transistor or a P-type or N-type IGBT. Description will be made below in the case where the switching devices SWL and SWH are N-channel MOS transistors.

The reference numeral 110 represents a high-potential-side driving circuit which includes a level shift circuit, a driving device DRVH and a power source E1 (whose output voltage will be hereinafter also designated by the same sign E1). The driving device DRVH performs on/off control on the high-potential-side switching device SWH in response to the output of the level shift circuit. The level shift circuit corresponds to all components of the high-potential-side driving circuit 110 except the driving device DRVH and the power source E1. The level shift circuit includes a series circuit of a resistor R1 (whose resistance value will be also designated by the same sign R1) and an N-channel MOS transistor MN1, a series circuit of a resistor R2 (whose resistance value will be also designated by the same sign R2) and an N-channel MOS transistor MN2, a flip-flop FF serving as a memory device, an inverter (inversion device) INV1 whose input is connected to a first connection point Vsetb (whose potential will be hereinafter also designated by the same sign Vsetb) as a connection point between the resistor R1 and the N-channel MOS transistor MN1 and whose output is connected to a set input terminal S of the flip-flop FF, an inverter INV2 whose input is connected to a second connection point Vrstb (whose potential will be hereinafter also designated by the same sign Vrstb) as a connection point between the resistor R2 and the N-channel MOS transistor MN2 and whose output is connected to a reset input terminal R of the flip-flop FF, and diodes D1 and D2. A signal $S_H$ outputted from an output terminal Q of the flip-flop FF is supplied to the driving device DRVH as a signal whose level has been shifted by the level shift circuit. An output of the driving device DRVH is connected to a gate terminal of the switching device SWH. The flip-flop FF, the driving device DRVH and a low-potential-side power supply terminal of the power source E1 are connected to a connection point Vsw (whose potential will be hereinafter also designated by the same sign Vsw) between the switching devices SWL and SWH so that the flip-flop FF and the driving device DRVH can receive power supply from the power source E1.

The invertors INV1 and INV2 also receive power supply from the power source E1 in the same manner.

One end of the series circuit of the resistor R1 and the N-channel MOS transistor MN1 and one end of the series circuit of the resistor R2 and the N-channel MOS transistor MN2 are connected to a power supply line Vb (whose potential will be hereinafter also designated by the same sign Vb) which is connected to a high-potential-side terminal of the power source E1, while the other ends thereof are connected to ground potential (GND). Pulse signals $P_{ON}$ and $P_{OFF}$, which are input signals to the level shift circuit of the high-potential-side driving circuit 110, are supplied to the gates of the N-channel MOS transistors MN1 and MN2. Anodes of the diodes D1 and D2 are connected to the connection point Vsw between the switching devices SWL and SWH, and cathodes of the diodes D1 and D2 are connected to the first connection point Vsetb and the second connection point Vrstb respectively. The diodes D1 and D2 clamp the input voltages Vsetb and Vrstb to the invertors INV1 and INV2 to prevent the input voltages Vsetb and Vrstb from falling below the potential Vsw and protect the invertors INV1 and INV2 from overvoltage, respectively.

The reference numeral 120 represents a low-potential-side driving circuit which includes a driving device DRVL and a power source E2. The driving device DRVL performs on/off control on the low-potential-side switching device SWL. The driving device DRVL receives power supply from the power source E2, amplifies a signal $S_L$ supplied to the driving device DRVL, and supplies the amplified signal $S_L$ to a gate terminal of the switching device SWL. With this configuration, the switching device SWL is turned on (continuity) when the signal $S_L$ is on an H (High) level, and the switching device SWL is turned off (discontinuity) when the signal $S_L$ is on an L (Low) level. That is, the signal $S_L$ is a signal which directly gives the switching device SWL an instruction to be on/off.

The input signals $P_{ON}$ and $P_{OFF}$ supplied to the high-potential-side driving circuit 110 are different from the signal $S_L$. The signal $P_{ON}$ is a signal which specifies the start timing of an on period (the end timing of an off period) of the switching device SWH, and the signal $P_{OFF}$ is a signal which specifies the start timing of an off period (the end timing of an on period) of the switching device SWH. FIG. 20 shows a timing chart for explaining a level shift operation. When the signal $P_{ON}$ is brought into the H level, the N-channel MOS transistor MN1 turns on to bring the potential Vsetb into the L level. The potential Vsetb is inputted to the inverter INV1 to bring the output of the inverter INV1 into the H level. Thus, the flip-flop FF is set to bring the signal $S_H$ into the H level to thereby turn on the switching device SWH. On the other hand, when the signal $P_{OFF}$ is brought into the H level, the N-channel MOS transistor MN2 turns on to bring the potential Vrstb into the L level. The potential Vrstb is inputted to the inverter INV2 to bring the output of the inverter INV2 into the H level. Thus, the flip-flop FF is reset to bring the signal $S_H$ into the L level to thereby turn off the switching device SWH.

Except a dead time when both the switching devices SWL and SWH are off, the switching devices SWL and SWH are turned on/off complementarily (when one is off, the other is on). When the switching device SWL is on, the potential Vsw at the connection point Vsw is equal to the ground potential. When the switching device SWH is on, the potential Vsw at the connection point Vsw is equal to the output voltage of the high-voltage power source Ein (whose output voltage will be also designated by the same sign Ein).

The reference sign RL represents a load for receiving power supply from the half-bridge circuit. The load RL is connected between the connection point Vsw and the ground potential.

Here, consider the case where the switching device SWH turns on in the state where the switching device SWL has been on. On this occasion, the potential Vsw at the connection point Vsw changes suddenly from the ground potential to the high voltage Ein. When the N-channel MOS transistors MN1 and MN2 are off at that time, a false signal called dv/dt noise is overlaid on the connection points Vsetb and Vrstb to set the L level in the both connection points Vsetb and Vrstb shown in FIG. 21 (incidentally, when the N-channel MOS transistors MN1 and MN2 are on, their on states lead to the L level in the connection points Vsetb and Vrstb.). Thus, there arises a problem that a set signal and a reset signal are supplied to the flip-flop FF concurrently to make the output of the flip-flop FF indefinite, that is, a problem that whether the switching device SWH is on or off becomes indefinite. In FIG. 21, the potentials Vsetb and Vrstb before the rising phase of the potential Vsw show the same normal signals as those in FIG. 20. The dv/dt noise will be described below.

A power supply line Vb has potential obtained by adding the constant voltage E1 to the potential Vsw. When the potential Vsw rises, the potential Vb also rises in the same manner (the differential coefficients of the both are equal to each other). That is, this leads to increase in the voltage Vb which should be applied to the series circuit of the resistor R1 and the N-channel MOS transistor MN1 and the series circuit of the resistor R2 and the N-channel MOS transistor MN2. On the other hand, due to parasitic capacitance Cds1, Cds2 between the source and the drain of each N-channel MOS transistor MN1, MN2, change of each potential Vsetb, Vrstb cannot follow the sudden change of the potential Vb. Thus, the difference between the potential Vb and the potential Vsetb, Vrstb becomes larger. In view of each inverter INV1, INV2, this leads to decrease input voltage. This causes the dv/dt noise. Theoretical analysis will be performed on the dv/dt noise below.

FIG. 22 shows a model for analyzing the dv/dt noise. This model includes a series circuit of a resistor R (whose resistance value will be also designated by the same sign R) and a capacitor C (whose capacitance value will be also designated by the same sign C). The series circuit is connected between potential V(t) and ground potential. The resistor R and the capacitor C correspond to each resistor R1, R2 and each parasitic capacitance Cds1, Cds2 shown in FIG. 19 respectively. In addition, the potential V(t) corresponds to the potential Vb. The dv/dt noise becomes a problem when the N-channel MOS transistors MN1 and MN2 are off. In this model, therefore, the channel MOS transistors MN1 and MN2 are regarded as off so as to be ignored. In addition, the diodes D1 and D2 in FIG. 19 are also ignored in this model. Assume that the potential at the connection point between the resistor R and the capacitor C is Vx (which corresponds to the potential Vsetb, Vrstb in FIG. 19), and the initial values of the potentials V(t) and Vx are Vo. Those initial values correspond to a certain steady state where the switching device SWL is on and the switching device SWH is off in the circuit shown in FIG. 19 while the potential Vb and the potential Vx are Vo. The voltage Vo is equal to the potential Vb when the potential Vsw is zero. Therefore, the voltage Vo corresponds to the voltage E1. When those initial values are taken, how the potential Vx changes in response to sudden increase of the potential V(t) is analyzed.

In FIG. 22, a current flowing in the resistor R is integrated by the capacitor C to change the potential Vx. This is expressed by the following Equation (1).

$$Vx = Vo + \frac{1}{CR}\int (V(t) - Vx)dt \qquad (1)$$

When Equation (1) is differentiated, the following Equation (2) can be obtained.

$$CR\frac{dVx}{dt} + Vx = V(t) \qquad (2)$$

The suddenly increasing potential V(t) can be expressed by Equation (3), where k is a constant, which corresponds to the time-derivative value of the potential in the power supply line Vb, which is equal to the time-derivative value of the potential Vsw.

$$V(t) = Vo + kt \qquad (3)$$

When Equation (3) is substituted into Equation (2), the following Equation (4) can be obtained.

$$CR\frac{dVx}{dt} + Vx = Vo + kt \qquad (4)$$

Equation (4) is a state equation for this model. A general solution of this differential equation can be provided by the following Equation (5).

$$Vx = A + kt + B \times \exp\left(-\frac{t}{CR}\right) \qquad (5)$$

In Equation (5), A and B are constants. First, Equation (5) is differentiated to obtain the following Equation (6).

$$\frac{dVx}{dt} = k - \left(\frac{B}{CR}\right) \times \exp\left(-\frac{t}{CR}\right) \qquad (6)$$

When Equations (5) and (6) are substituted into Equation (4), the following Equation (7) can be obtained.

$$CR\frac{dVx}{dt} + Vx = kCR + A + kT = Vo + kt \qquad (7)$$

From the middle part and the right part of Equation (7), the value of the constant A can be obtained by the following Equation (8)

$$A = Vo - kCR \qquad (8)$$

When Equation (8) is substituted into Equation (5), the potential Vx can be provided by the following Equation (9).

$$Vx = (Vo - kCR) + kt + B \times \exp\left(-\frac{t}{CR}\right) \qquad (9)$$

Here, the following Equation (10) can be obtained when the aforementioned condition that the initial value of the potential Vx is Vo is substituted into Equation (9).

$$Vx(t=0) = (Vo - kCR) + B = Vo \tag{10}$$

Accordingly, the value of the constant B can be provided by the following Equation (11).

$$B = kCR \tag{11}$$

When Equation (11) is substituted into Equation (9), the following Equation (12) can be finally obtained for the potential Vx.

$$Vx = Vo + kt - kCR\left(1 - \exp\left(-\frac{t}{CR}\right)\right) \tag{12}$$

From Equations (3) and (12), the voltage (V(t)−Vx) can be expressed by the following Equation (13).

$$V(t) - Vx = kCR\left(1 - \exp\left(-\frac{t}{CR}\right)\right) \tag{13}$$

Equation (13) is an equation which expresses the magnitude of the dv/dt noise. When the value of the dv/dt noise obtained by Equation (13) increases, the input level to the inverters INV1 and INV2 shown in FIG. 19 becomes L (Low) to invert the outputs of the inverters INV1 and INV2. As is apparent from Equation (13), the larger the constant k is, that is, the sharper the change of the potential Vsw is, the greater the dv/dt noise is. Therefore, the constant k can be regarded as a constant showing the magnitude of the dv/dt noise.

The potential Vb cannot keep increasing without limit as shown in Equation (3). When the potential Vb reaches Ein+E1, the potential Vb stays at that value. FIG. 23 shows a model of the potential V(t) showing the behavior of the potential Vb. In FIG. 23, Vm designates a value corresponding to Ein+E1, and t1 designates the time when the potential V(t) reaches the value Vm. The analysis of the behavior of the potential Vsw after the time t1 when the potential V(t) becomes constant after reaching the value Vm is shown below.

When the value of the potential Vx at the time t1 is V1, Equation (14) is established in the same manner as Equation (1).

$$Vx = V1 + \frac{1}{CR}\int (Vm - Vx)dt \tag{14}$$

From this Equation, Equation (15) can be derived in the same manner as Equation (2).

$$CR\frac{dVx}{dt} + Vx = Vm \tag{15}$$

A general solution of Equation (15) can be provided by the following Equation (16), in which D designates a constant.

$$Vx = Vm + D \times \exp\left(-\frac{t-t1}{CR}\right) \tag{16}$$

When D is obtained from the initial condition of Vx=V1 at the time t1, the potential Vx can be finally expressed by the following Equation (17).

$$Vx = Vm - (Vm - V1) \times \exp\left(-\frac{t-t1}{CR}\right) \tag{17}$$

From this Equation, V(t)−Vx=Vm−Vx for showing the dv/dt noise can be obtained by the following Equation (18).

$$Vm - Vx = (Vm - V1) \times \exp\left(-\frac{t-t1}{CR}\right) \tag{18}$$

From Equation (18), it is understood that the dv/dt noise is attenuated in an exponential function of a time constant CR when the potential V (t) is constant.

As described above, the dv/dt noise generated thus leads to a problem such that a set signal and a reset signal are supplied to the flip-flop FF concurrently. Solutions to this problem have been proposed in the background art (for example, Japanese Patent No. 3550453 (FIG. 23)). A background-art half-bridge circuit having a function of preventing malfunction caused by the dv/dt noise as disclosed in Japanese Patent No. 3550453 will be described with reference to FIG. 24. Parts same as those in FIG. 19 are referred to by the same numerals correspondingly, and description thereof will be omitted. FIG. 24 is the same as FIG. 19, except that the diodes D1 and D2 in FIG. 19 are removed, a Zener diode ZD1 and a P-channel MOS transistor MP10 are connected to the resistor R1 in parallel and a Zener diode ZD2 and a P-channel MOS transistor MP20 are connected to the resistor R2 in parallel while the relation of R1>R2 is established. The gate of the P-channel MOS transistor MP10 is connected to the second connection point Vrstb and the gate of the P-channel MOS transistor MP20 is connected to the first connection point Vsetb.

Here, the Zener diodes ZD1 and ZD2 limit input voltages to invertors INV1 and INV2 in place of the diodes D1 and D2. The function of preventing malfunction caused by the dv/dt noise is secured by the relation of R1>R2. That is, the magnitude of the dv/dt noise also depends on the resistance values R1 and R2 as shown in Equation (13). The larger the resistance values are, the greater the dv/dt noise is. Therefore, as shown in FIG. 25, if R1 is set to be larger than R2, the relation of Vsetb<Vrstb can be always established when the dv/dt noise is generated. Thus, the set input surpasses the reset input so that the flip-flop FF can be kept to be set. This is to keep the flip-flop FF set on the assumption that the dv/dt noise is generated only when the potential Vsw increases suddenly, that is, only when the flip-flop FF is set to turn on the high-potential-side switching device SWH. The P-channel MOS transistors MP10 and MP20 are provided for expanding the condition of Vsetb<Vrstb. That is, when the dv/dt noise is generated, each potential Vsetb, Vrstb takes a value as shown in FIG. 25. Accordingly, the on resistance of the P-channel MOS transistor MP10 pulling up the potential Vrstb is made smaller than the on resistance of the P-channel MOS transistor MP20 pulling up the potential Vsetb so that the difference between the potential Vsetb and the potential Vrstb can be expanded.

However, due to resonance generated during soft switching, the dv/dt noise may be generated also when the flip-flop FF has been reset. The aforementioned background-art half-bridge circuit cannot deal with such a phenomenon. Another background-art half-bridge circuit which can deal with such a phenomenon is disclosed in Japanese Patent No. 3550453. FIG. 26 shows the configuration of the half-bridge circuit.

In the circuit shown in FIG. 26, parts same as those in FIG. 24 are referred to by the same numerals correspondingly, and description thereof will be omitted. The circuit in FIG. 26 is the same as the circuit in FIG. 24, except that the gate of the P-channel MOS transistor MP10 is connected to a state-signal output terminal Q of the flip-flop FF and the gate of the P-channel MOS transistor MP20 is connected to a state-signal inverted output terminal QB of the flip-flop FF. In addition, the relation of R1=R2 is established. Due to this configuration, the P-channel MOS transistors MP20 and MP10 are on and off respectively when the flip-flop FF is set to turn on the high-potential-side switching device SWH. Accordingly, the relation of Vsetb<Vrstb is established when the dv/dt noise is generated. Thus, the flip-flop FF can be kept to beset. Accordingly, the high-potential-side switching device SWH can be kept on. In addition, the P-channel MOS transistors MP10 and MP20 are on and off respectively when the flip-flop FF is reset to turn off the high-potential-side switching device SWH. Accordingly, the relation of Vsetb>Vrstb is established when the dv/dt noise is generated. Thus, the flip-flop FF can be kept to be reset. As a result, the high-potential-side switching device SWH can be kept off. That is, whether the high-potential-side switching device SWH is on or off, the on or off state can be kept.

However, in the background-art half-bridge circuit shown in FIG. 26, either the P-channel MOS transistor MP10 or MP20 is always on. In order to invert the state of the flip-flop FF, of the N-channel MOS transistors MN1 and MN2, it is necessary to turn on the N-channel MOS transistor which is connected to the P-channel MOS transistor which is on. Therefore, there is a problem that both the P-channel MOS transistor and the N-channel MOS transistor which are connected between the potential Vb and the ground potential are turned on so that a through current flows therein. In addition, in order to guarantee that the potential Vsetb and the potential Vrstb take the L level for the invertors INV1 and INV2 respectively when the two MOS transistors are on, it is necessary to make the on resistance of each N-channel MOS transistor MN1, MN2 smaller than the on resistance of each P-channel MOS transistor MP10, MP20. The N-channel MOS transistors MN1 and MN2 are high-voltage MOS transistors, whose on resistance is higher than a normal MOS transistor. It is therefore necessary to increase the size (gate width) of the N-channel MOS transistors MN1 and MN2 to decrease their on resistance. Thus, there arises a problem that the through current becomes larger and the semiconductor chip size also increases.

Accordingly, to solve the foregoing problems, an object of the invention is to provide a level shift circuit which can effectively deal with malfunction caused by dv/dt noise regardless of an on or off state of a high-potential-side switching device SWH, while generation of a through current can be suppressed.

Further objects and advantages of the invention will be apparent from the following description of the invention.

SUMMARY OF THE INVENTION

In order to solve the aforementioned problems, according to a first configuration of the invention, there is provided a level shift circuit for transmitting an input signal from a primary-side potential system to a system operating in a secondary-side potential system different from the primary-side potential system. The level shift circuit includes a first series circuit, which includes a first resistor circuit and a first switching device connected between a high-potential-side power supply potential of the secondary-side potential system and a low-potential-side power supply potential of the primary-side potential system, and a second series circuit, which includes a second resistor circuit and a second switching device connected between the high-potential-side power supply potential of the secondary-side potential system and the low-potential-side power supply potential of the primary-side potential system. The level shift circuit also includes a transmission circuit which operates in the secondary-side potential system and has a first input and a second input. The first input being a potential at a first connection point is a connection point between the first resistor circuit and the first switching device of the first series circuit. The second input being a potential at a second connection point is a connection point between the second resistor circuit and the second switching device of the second series circuit.

The level shift circuit also includes a memory device, which operates in the secondary-side potential system and to which an output of the transmission circuit is supplied, and a feedback circuit, which pulls one of the first and second connection points; up to the high-potential side power supply potential of the secondary-side potential system and pulls the other down to the low-potential-side power supply potential of the secondary-side potential system in accordance with an output of the memory device. The signals of the primary-side potential system for controlling on/off of the first and second switching devices are supplied to the first and second switching devices respectively. The transmission circuit transmits a signal decided based on the first and second inputs to the memory device when only one of the first and second switching devices is turned on while the transmission circuit does not transmit the signal decided based on the first and second inputs to the memory device when the first and second inputs of the transmission circuit turn on the first and second switching devices concurrently or become in the same state as the on-state.

According to a second configuration of the invention, there is provided a level shift circuit according to the first configuration, wherein the first resistor circuit includes a first resistor, the second resistor circuit includes a second resistor, the feedback circuit includes a third resistor whose one end is connected to the first connection point while an inversion signal of the memory device is applied to the other end, and a fourth resistor whose one end is connected to the second connection point while a non-inverting signal of the memory device is applied to the other end.

According to a third configuration of the invention, there is provided a level shift circuit according to the second configuration, wherein the transmission circuit provides high impedance for an output thereof when the first and second inputs of the transmission circuit turn on the first and second switching devices concurrently or become in the same state as the on-state.

According to a fourth configuration of the invention, there is provided a level shift circuit according to the third configuration, wherein the transmission circuit includes an inversion device, a P-channel MOS transistor series circuit in which first and second P-channel MOS transistors are connected in series, and an N-channel MOS transistor series circuit in which first and second N-channel MOS transistors are connected in series. The P-channel MOS transistor series circuit and the N-channel MOS transistor series circuit are connected in series between the high-potential-side power supply potential and the low-potential-side power supply potential in the secondary-side potential system. The first connection point is connected to gates of the first P-channel MOS transistor and the first N-channel MOS transistor. The second connection point is connected to an input terminal of the inversion device. An output terminal of the inversion device is connected to gates of the second P-channel MOS transistor and the second N-channel MOS transistor. A connection point between the P-channel MOS transistor series circuit and the N-channel MOS transistor series circuit is connected to a data input terminal of the memory device.

According to a fifth configuration of the invention, there is provided a level shift circuit according to the fourth configuration, wherein the memory device includes a buffer circuit with a resistor connected between an input and an output of the buffer circuit.

According to a sixth configuration of the invention, there is provided a level shift circuit according to the fifth configuration, wherein the buffer circuit includes two inversion devices connected in series.

According to a seventh configuration of the invention, there is provided a level shift circuit according to the second configuration, further comprising a third P-channel MOS transistor connected in parallel with the first resistor and a fourth P-channel MOS transistor connected in parallel with the second resistor. A gate of the third P-channel MOS transistor is connected to a connection point between the second resistor and the fourth resistor. A gate of the fourth P-channel MOS transistor is connected to a connection point between the first resistor and the third resistor.

According to an eighth configuration of the invention, there is provided a level shift circuit according to the seventh configuration, wherein a voltage ratio between the first resistor and the third resistor is decided so that a potential at the first connection point when an inversion signal of the memory device serves as the low-potential-side power supply potential of the secondary-side potential system while the first switching device is off can be located between a potential obtained by subtracting a threshold voltage of the fourth P-channel MOS transistor from the high-potential-side power supply potential of the secondary-side potential system and a potential obtained by adding a threshold voltage of the transmission circuit for the potential at the first connection point to the low-potential-side power supply potential of the secondary-side potential system. The voltage ratio between the first resistor and the third resistor is decided so that the potential at the second connection point when a non-inverting signal of the memory device serves as the low-potential-side power supply potential of the secondary-side potential system while the second switching device is off can be located between a potential obtained by subtracting a threshold voltage of the third P-channel MOS transistor from the high-potential-side power supply potential of the secondary-side potential system and a potential obtained by adding a threshold voltage of the transmission circuit for the potential at the second connection point to the low-potential-side power supply potential of the secondary-side potential system.

According to a ninth configuration of the invention, there is provided a level shift circuit according to the seventh configuration, wherein the transmission circuit provides high impedance for an output thereof when the first and second inputs of the transmission circuit turn on the first and second switching devices concurrently or become in the same state as the on-state.

According to a tenth configuration of the invention, there is provided a level shift circuit according to the ninth configuration, wherein the transmission circuit includes an inversion device, a P-channel MOS transistor series circuit in which first and second P-channel MOS transistors are connected in series, and an N-channel MOS transistor series circuit in which first and second N-channel MOS transistors are connected in series. The P-channel MOS transistor series circuit and the N-channel MOS transistor series circuit are connected in series between the high-potential-side power supply potential and the low-potential-side power supply potential in the secondary-side potential system. The first connection point is connected to gates of the first P-channel MOS transistor and the first N-channel MOS transistor. The second connection point is connected to an input terminal of the inversion device. An output terminal of the inversion device is connected to gates of the second P-channel MOS transistor and the second N-channel MOS transistor. A connection point between the P-channel MOS transistor series circuit and the N-channel MOS transistor series circuit is connected to a data input terminal of the memory device.

According to an eleventh configuration of the invention, there is provided a level shift circuit according to the tenth configuration, wherein the memory device includes a buffer circuit with a resistor connected between an input and an output of the buffer circuit.

According to a twelfth configuration of the invention, there is provided a level shift circuit according to the eleventh configuration, wherein the buffer circuit includes two inversion devices connected in series.

According to a thirteenth configuration of the invention, there is provided a level shift circuit according to the first configuration, wherein the first resistor circuit includes a first resistor and a fifth resistor connected in series, the second resistor circuit includes a second resistor and a sixth resistor connected in series, the feedback circuit includes a third P-channel MOS transistor connected in parallel with the first resistor, a fourth P-channel MOS transistor connected in parallel with the second resistor, a fifth P-channel MOS transistor connected between the high-potential-side power supply potential of the secondary-side potential system and the first connection point, a sixth P-channel MOS transistor connected between the high-potential-side power supply potential of the secondary-side potential system and the second connection point, a seventh resistor whose one end is connected to the second connection point and a gate of the fifth P-channel MOS transistor while the other end is connected to a gate of the third P-channel MOS transistor, and an eighth resistor whose one end is connected to the first connection point and a gate of the sixth P-channel MOS transistor while the other end is connected to a gate of the fourth P-channel MOS transistor. A non-inverting signal of the memory device is applied to the other end of the seventh resistor, and an inversion signal of the memory device is applied to the other end of the eighth resistor.

According to a fourteenth configuration of the invention, there is provided a level shift circuit according to the thirteenth configuration, wherein the transmission circuit provides high impedance for an output thereof when the first and second inputs of the transmission circuit turn on the first and second switching devices concurrently or become in the same state as the on-state.

According to a fifteenth configuration of the invention, there is provided a level shift circuit according to the fourteenth configuration, wherein the transmission circuit includes an inversion device, a P-channel MOS transistor series circuit in which first and second P-channel MOS transistors are connected in series, and an N-channel MOS transistor series circuit in which first and second N-channel MOS transistors are connected in series. The P-channel MOS transistor series circuit and the N-channel MOS transistor series circuit are connected in series between the high-potential-side power supply potential and the low-potential-side power supply potential in the secondary-side potential system. The first connection point is connected to gates of the first P-channel MOS transistor and the first N-channel MOS transistor. The second connection point is connected to an input terminal of the inversion device. An output terminal of the inversion device is connected to gates of the second P-channel MOS transistor and the second N-channel MOS transistor. A connection point between the P-channel MOS transistor series circuit and the N-channel MOS transistor series circuit is connected to a data input terminal of the memory device.

According to a sixteenth configuration of the invention, there is provided a level shift circuit according to the fifteenth configuration, wherein the memory device includes a buffer circuit with a resistor connected between an input and an output of the buffer circuit.

According to a seventeenth configuration of the invention, there is provided a level shift circuit according to the sixteenth configuration, wherein the buffer circuit includes two inversion devices connected in series.

According to an eighteenth configuration of the invention, there is provided a level shift circuit according to the first configuration, wherein the first resistor circuit includes a first resistor, the second resistor circuit includes a second resistor, the feedback circuit includes a first series resistor circuit which includes a ninth resistor and a tenth resistor connected in series, and a second series resistor circuit which includes an eleventh resistor and a twelfth resistor connected in series. One end of the first series resistor circuit is connected to the first connection point. One end of the second series resistor circuit is connected to the second connection point. A connection point between the ninth resistor and the tenth resistor is connected to a gate of the fourth P-channel MOS transistor. A connection point between the eleventh resistor and the twelfth resistor is connected to a gate of the third P-channel MOS transistor. An inversion signal of the memory device is applied to the other end of the first series resistor circuit, and a non-inverting signal of the memory device is applied to the other end of the second series resistor circuit.

According to a nineteenth configuration of the invention, there is provided a level shift circuit according to the eighteenth configuration, wherein the transmission circuit provides high impedance for an output thereof when the first and second inputs of the transmission circuit turn on the first and second switching devices concurrently or become in the same state as the on-state.

According to a twentieth configuration of the invention, there is provided a level shift circuit according to the nineteenth configuration, wherein the transmission circuit includes an inversion device, a P-channel MOS transistor series circuit in which first and second P-channel MOS transistors are connected in series, and an N-channel MOS transistor series circuit in which first and second N-channel MOS transistors are connected in series. The P-channel MOS transistor series circuit and the N-channel MOS transistor series circuit are connected in series between the high-potential-side power supply potential and the low-potential-side power supply potential in the secondary-side potential system. The first connection point is connected to gates of the first P-channel MOS transistor and the first N-channel MOS transistor. The second connection point is connected to an input terminal of the inversion device. An output terminal of the inversion device is connected to gates of the second P-channel MOS transistor and the second N-channel MOS transistor. A connection point between the P-channel MOS transistor series circuit and the N-channel MOS transistor series circuit is connected to a data input terminal of the memory device.

According to a twenty-first configuration of the invention, there is provided a level shift circuit according to the twentieth configuration, wherein the memory device includes a buffer circuit with a resistor connected between an input and an output of the buffer circuit.

According to a twenty-second configuration of the invention, there is provided a level shift circuit according to the twenty-first configuration, wherein the buffer circuit includes two inversion devices connected in series.

A level shift circuit according to the invention includes first and second switching devices, a transmission circuit, and a memory circuit. Signals from a primary-side potential system are supplied to the first and second switching devices while the first and second switching devices are pulled up to a high-potential-side power supply potential of a secondary-side potential system by a first resistor circuit and a second resistor circuit respectively. The transmission circuit has a first input and a second input. The first input is a potential at a first connection point which is a connection point between the first resistor circuit and the first switching device. The second input is a potential at a second connection point which is a connection point between the second resistor circuit and the second switching device. An output of the transmission circuit is supplied to the memory device. Data of the level-shifted output of the transmission circuit is stored in the memory device. In accordance with an output of the memory device, one of the first and second connection points is pulled up to the high-potential-side power supply potential of the secondary-side potential system by a feedback circuit while the other is pulled down to the low-potential-side power supply potential of the secondary-side potential system. Thus, a resistance value of a combined resistance for pulling up or down the first and second switching devices is varied in accordance with the output of the memory device so that measures against malfunction caused by dv/dt noise can be taken without generating a through current.

Signals from the primary-side potential system are supplied to the first and second switching devices so as to control on/off of the first and second switching devices, respectively. When only one of the first and second switching devices is turned on, the transmission circuit transmits to the memory device a signal decided based on the first and second inputs. When the first and second inputs of the transmission circuit turn on the first and second switching devices concurrently or become in the same state as the on-state, the transmission circuit does not transmit to the memory device the signal decided based on the first and second inputs.

BRIEF DESCRIPTION OF THE DRAWINGS

FIG. 5 is another chart for explaining the condition of changes in potential at the first connection point Vsetb and the second connection point Vrstb when dv/dt noise is generated in Embodiment 1;

FIG. 6 is a further chart for explaining the condition of changes in potential at the first connection point Vsetb and the second connection point Vrstb when dv/dt noise is generated in Embodiment 1;

DETAILED DESCRIPTION OF THE INVENTION

A level shift circuit according to the invention will be described below with reference to the drawings.

Embodiment 1

Figure 1:
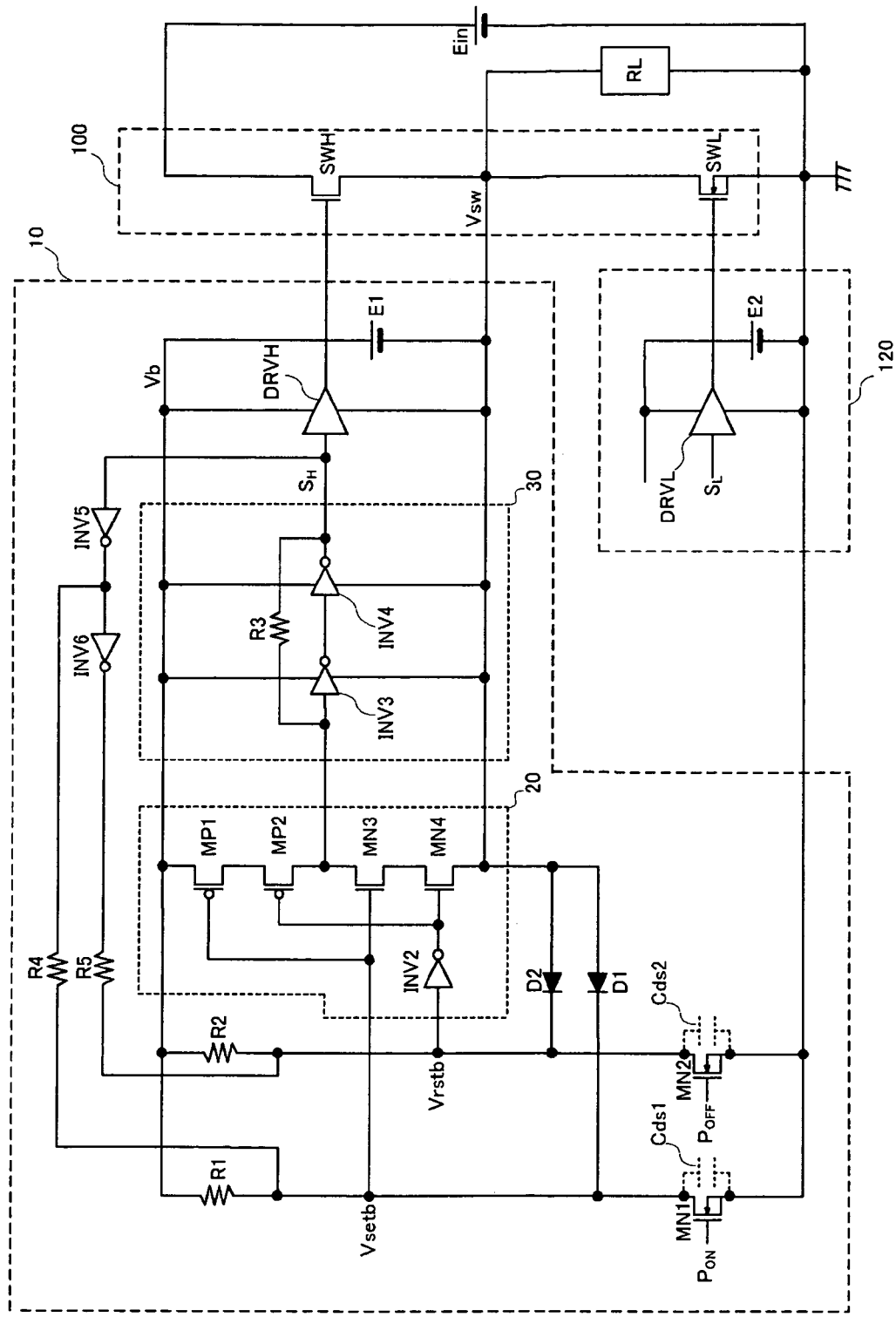
FIG. 1 is a circuit diagram showing a first embodiment (Embodiment 1) of a half-bridge circuit using a level shift circuit according to the invention.

FIG. 1 shows a first embodiment of a half-bridge circuit using a level shift circuit according to the invention. Parts which can be shared with those in FIGS. 19, 24, and 26 are referred to by the same numerals correspondingly, and detailed description thereof will be omitted.

Figure 19:
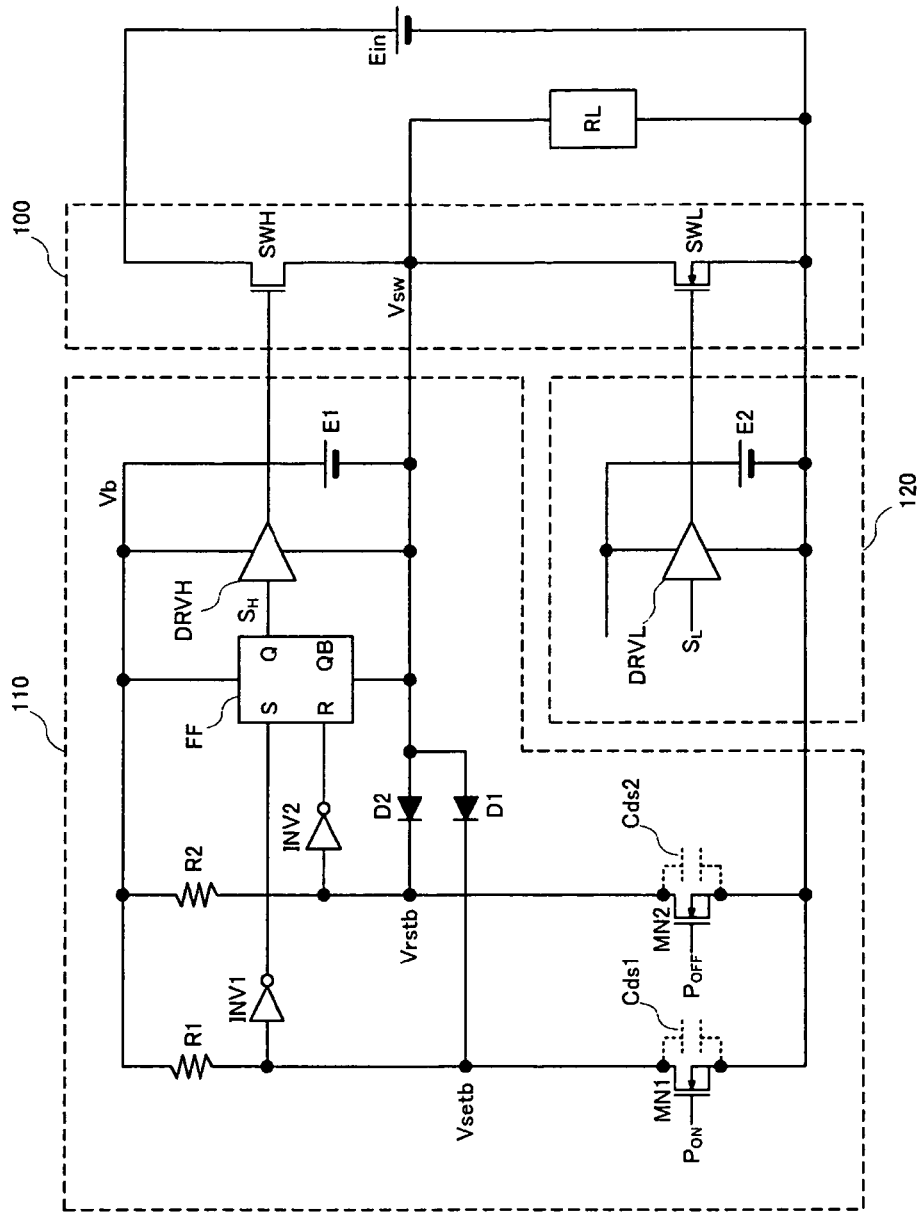
FIG. 19 is a circuit diagram showing a configuration example of a half-bridge circuit using a background-art level shift circuit.
Figure 20:
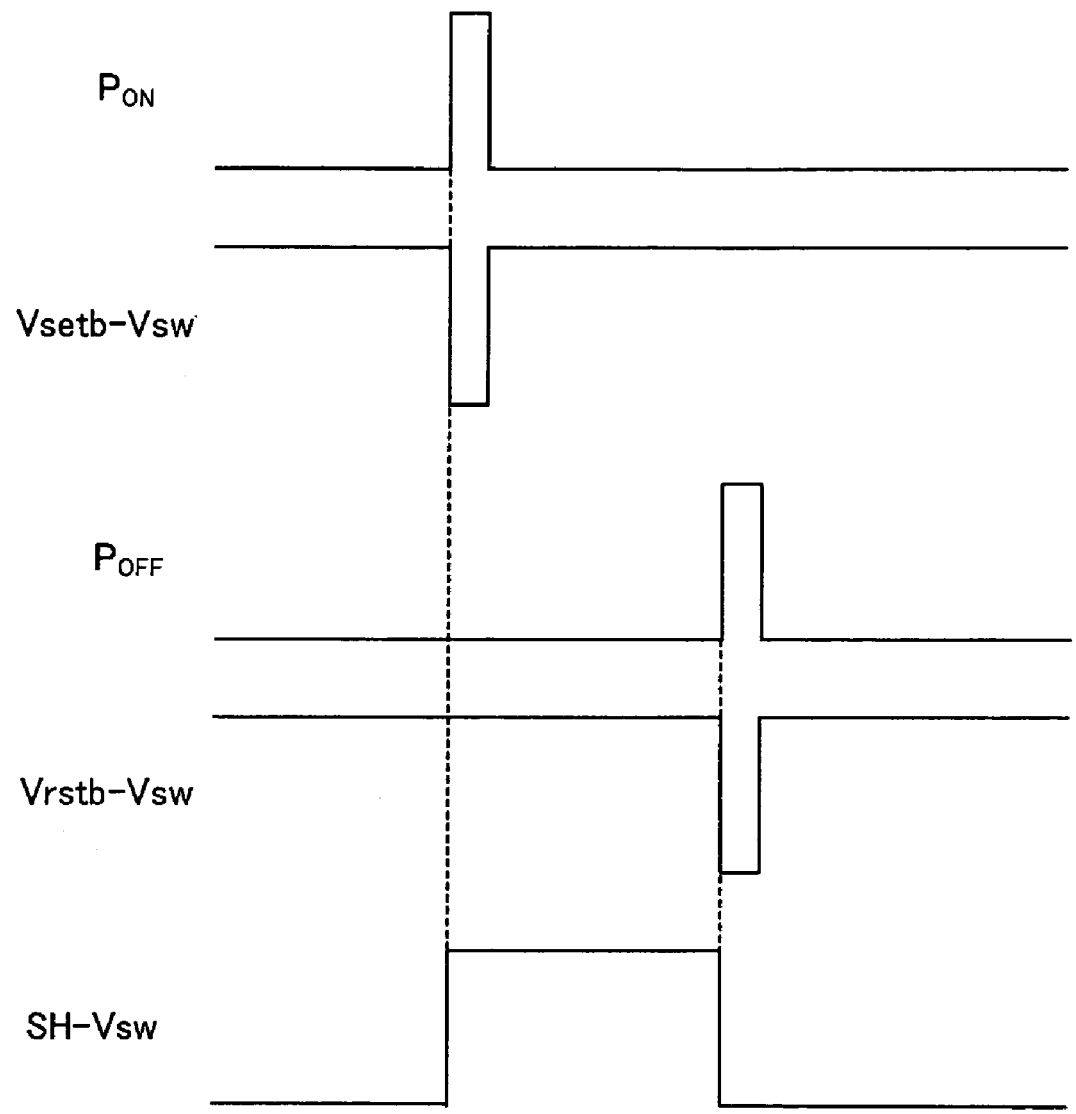
FIG. 20 is a timing chart for explaining a level shift operation.
Figure 21:
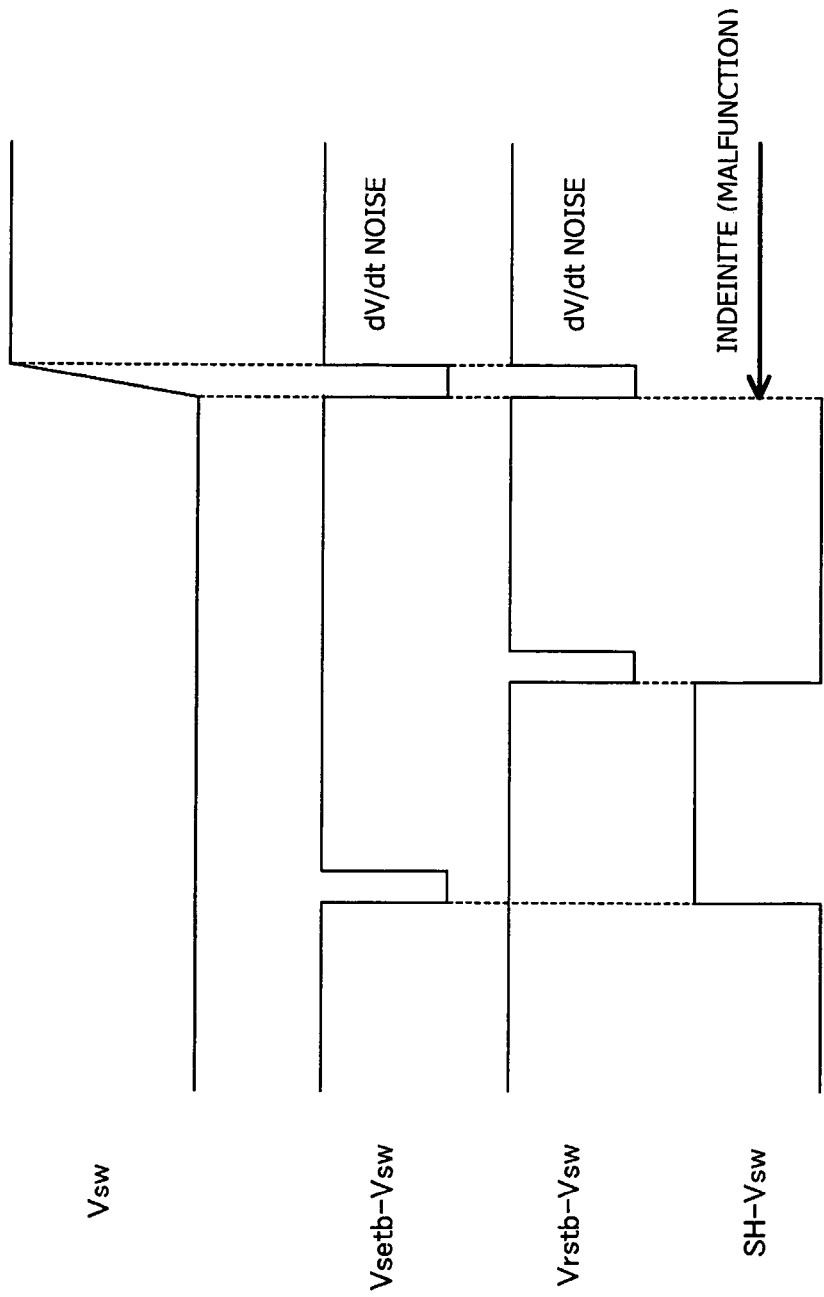
FIG. 21 is a timing chart for explaining dv/dt noise.
Figure 24:
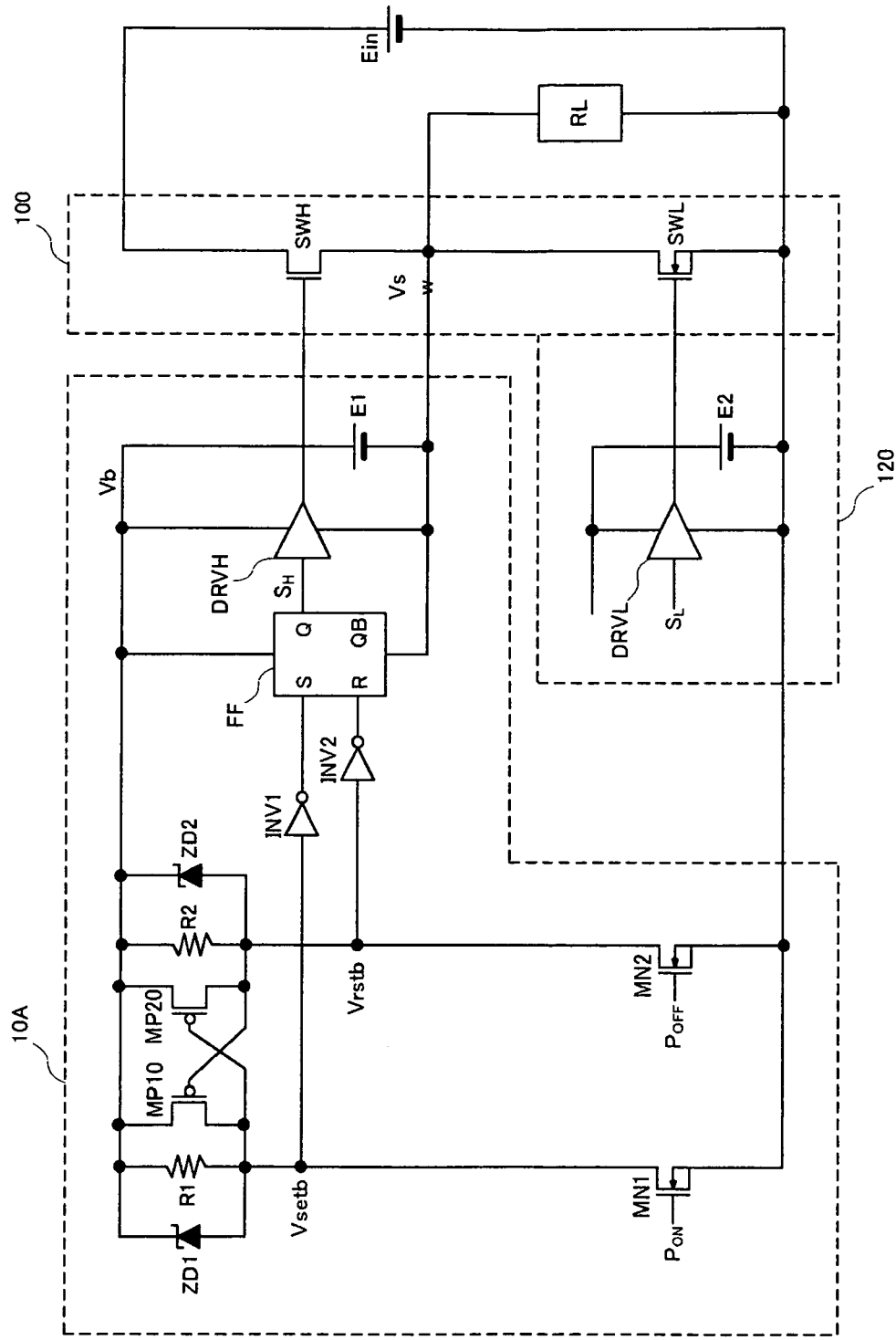
FIG. 24 is a circuit diagram for explaining a background-art half-bridge circuit provided with a function of preventing malfunction caused by dv/dt noise, as disclosed in Japanese Patent No. 3550453.
Figure 25:
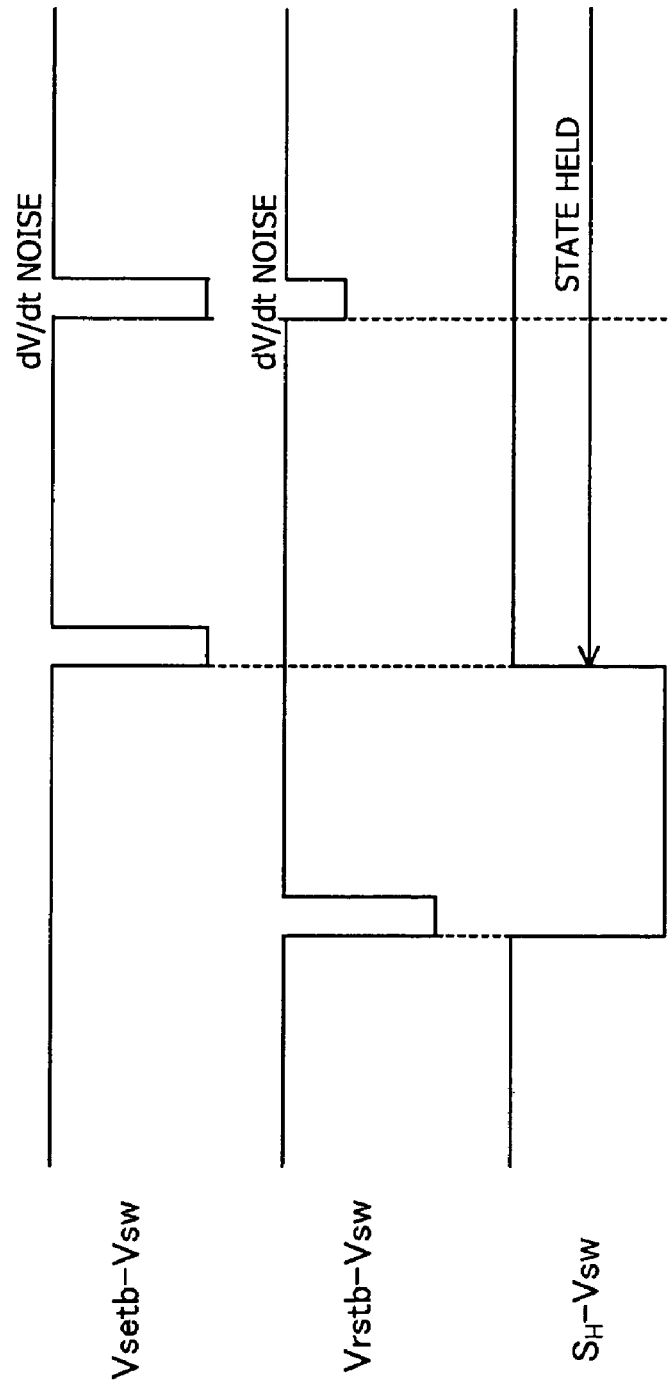
FIG. 25 is a chart for explaining a countermeasure against dv/dt noise.
Figure 26:
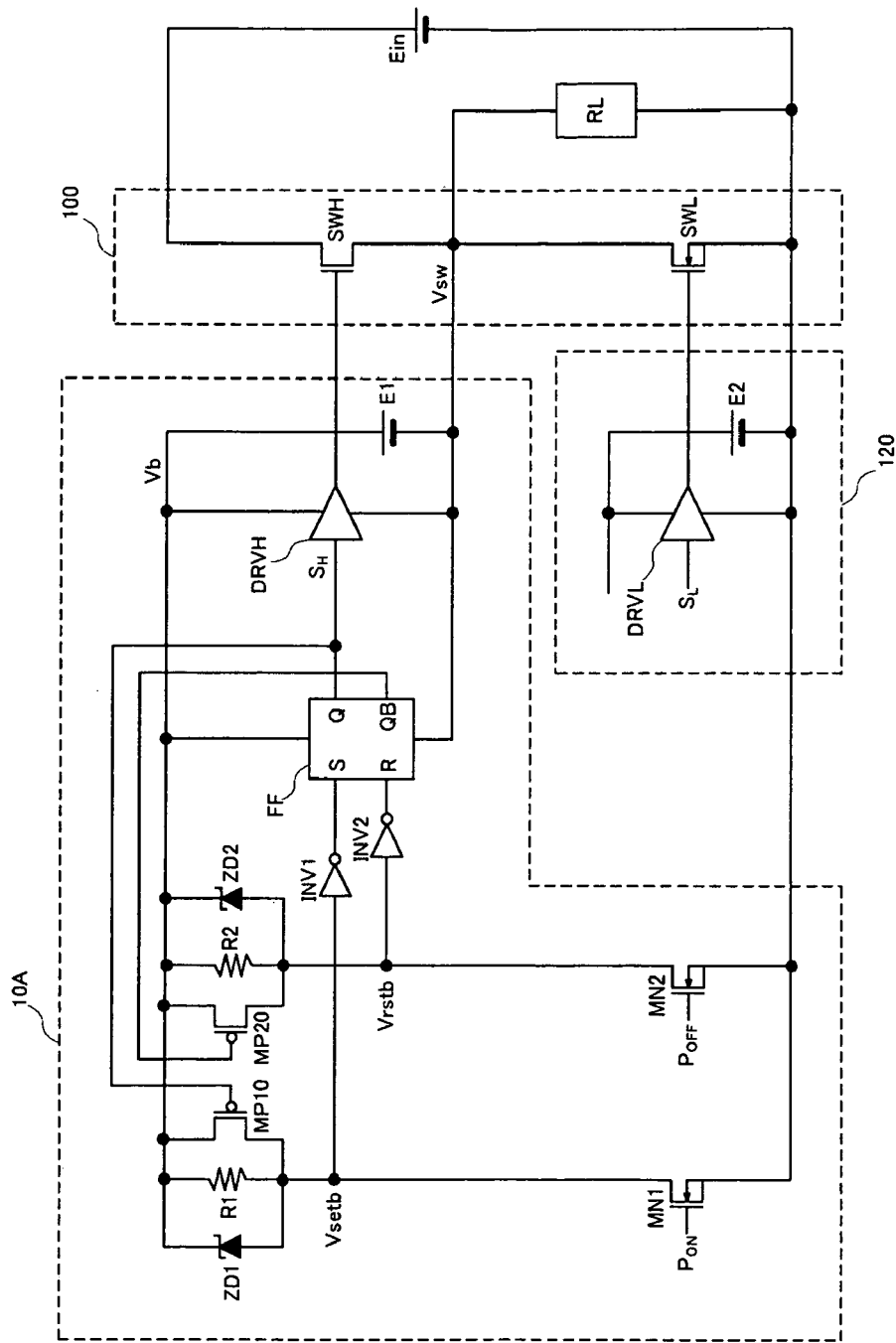
FIG. 26 is a circuit diagram for explaining another background-art half-bridge circuit disclosed in Japanese Patent No. 3550453.

The half-bridge circuit shown in FIG. 1 is different from that in FIG. 19, 24, or 26 at the following chief points. That is, the inverter INV1 is removed, and a transmission circuit 20 (in which the inverter INV2 is incorporated) is provided newly. A latch circuit 30 including inverters INV3 and INV4 and a resistor R3 is provided in place of the flip-flop FF. From an output $S_H$ of the latch circuit 30, an inversion output and a forward output are obtained by inverters INV5 and INV6. The inversion output and the forward output are connected to a first connection point Vsetb and a second connection point Vrstb through resistors R4 and R5 respectively. The first connection point Vsetb is a connection point between a resistor R1 and an N-channel MOS transistor MN1. The resistor R1 forms a first resistor circuit. The second connection point Vrstb is a connection point between a resistor R2 and an N-channel MOS transistor MN2. The resistor R2 forms a second resistor circuit. In addition, diodes D1 and D2 are used as devices for limiting voltages to be inputted to the inverters INV1 and INV2 respectively in the same manner as in FIG. 19. However, Zener diodes ZD1 and ZD2 may be used in place of the diodes D1 and D2 in the same manner as in FIG. 24 or 26 (the same rule can be applied to the following embodiments). Here, the inverters INV5 and INV6 and the resistors R4 and R5 form a feedback circuit. As for the resistance values of the resistors R1, R2, R4, and R5, the relations of R1=R2 and R4=R5 are established.

The transmission circuit 20 includes a series circuit of P-channel MOS transistors MP1 and MP2 and N-channel MOS transistors MN3 and MN4, and an inverter INV2. Electric power is supplied from a power source E1 to the series circuit. An input terminal of the inverter INV2 is connected to the second connection point Vrstb, and an output terminal of the inverter INV2 is connected to gates of the P-channel MOS transistor MP2 and the N-channel MOS transistor MN4. A connection point between the P-channel MOS transistor MP2 and the N-channel MOS transistor MN3 serves as an output terminal of the transmission circuit 20. The output terminal is connected to an input terminal of the latch circuit 30. In addition, the first connection point Vsetb is connected to gates of the P-channel MOS transistor MP1 and the N-channel MOS transistor MN3. In addition, electric power is also supplied from the power source E1 to the inverter INV2.

The latch circuit 30 is constituted by the inverters INV3 and INV4 connected in series, and the resistor R3 connected between an input terminal of the inverter INV3 and an output terminal of the inverter INV4. In addition, electric power is also supplied from the power source E1 to the latch circuit 30. An input to the inverter INV3 serves as an input of the latch circuit 30, and an output from the inverter INV4 serves as an output of the latch circuit 30.

The latch circuit 30 is a circuit serving as follows. That is, when the value of the input to the latch circuit 30 is L or H, the latch circuit 30 stores and outputs the value. When the input turns high in impedance, the latch circuit 30 holds and outputs a value stored immediately before the input turns high in impedance.

The transmission circuit 20 is a circuit serving as follows. That is, when dv/dt noise is generated, that is, when both the potential Vsetb and the potential Vrstb are on the L level, the transmission circuit 20 makes its output high in impedance to give no influence to the latch circuit 30. That is, when both the potential Vsetb and the potential Vrstb are on the L level, both the N-channel MOS transistor MN3 and the P-channel MOS transistor MP2 are turned off. Thus, the connection point between the P-channel MOS transistor MP2 and the N-channel MOS transistor MN3 serving as the output terminal of the transmission circuit 20 becomes high in impedance. Since the input of the latch circuit 30 becomes high in impedance, the latch circuit 30 can hold a previous state so as to avoid any influence of the dv/dt noise. In addition, also when input signals $P_{ON}$=L and $P_{OFF}$=L are supplied from the outside to a high-potential-side driving circuit 10, that is, when both the potential Vsetb and the potential Vrstb are on the H level, the P-channel MOS transistor MP1 and the N-channel MOS transistor MN4 are turned off to make the output of the transmission circuit 20 high in impedance, so that the latch circuit 30 can keep holding the previous state.

Table 1 shows a table about states of the transmission circuit 20 and the latch circuit 30. In Table 1, Hi-Z in the latch input, that is, in the output of the transmission circuit 20 means high impedance. As is apparent from Table 1, when only one of the input signals $P_{ON}$ and $P_{OFF}$ is supplied to the high-potential-side driving circuit 10 (only one is on the H level), that is, when one of the potentials Vsetb and Vrstb is L and the other is H, information of the input signal $P_{ON}$, $P_{OFF}$ is transmitted from the transmission circuit 20 to the latch circuit 30. That is, the output of the transmission circuit 20 (latch input) becomes H when only the input signal $P_{ON}$ is H, and the output of the transmission circuit 20 (latch input) becomes L when only the input signal $P_{OFF}$ is H.

TABLE 1

| $P_{ON}$ | $P_{OFF}$ | Vsetb | Vrstb | MP1 | MP2 | MN3 | MN4 | Latch Input | $S_H$ |
|---|---|---|---|---|---|---|---|---|---|
| L | L | H | H | OFF | ON | ON | OFF | Hi-Z | State Held |
| H | L | L | H | ON | ON | OFF | OFF | H | H |
| L | H | H | L | OFF | OFF | ON | ON | L | L |
| H | H | L | L | ON | OFF | OFF | ON | Hi-Z | State Held |

In this manner, in this embodiment, the output of the transmission circuit 20 is made high in impedance when dv/dt noise is generated, so that the influence of the dv/dt noise can be eliminated. In Table 1, for the sake of convenience, the state where both the input signals $P_{ON}$ and $P_{OFF}$ are H shows that the dv/dt noise has been generated. In fact, the H-level input signals $P_{ON}$ and $P_{OFF}$ are not supplied from the outside. In addition, the connection order of the P-channel MOS transistors MP1 and MP2 and/or the connection order of the N-channel MOS transistors MN3 and MN4 may be changed.

The configuration of the transmission circuit 20 is not limited to what is shown in FIG. 1. Any configuration may be used if it can make the output of the transmission circuit high in impedance when the inputs Vsetb and Vrstb to the transmission circuit turn on the N-channel MOS transistors MN1 and MN2 concurrently or become in the same state as the on-state, and when only one of the N-channel MOS transistors MN1 and MN2 is turned on, the transmission circuit can output a voltage at a level corresponding to the on state.

In FIG. 1, when one of potentials at terminals of the resistors R4 and R5, which terminals are not connected to the resistors R1 and R2 is on the H level, the other is on the L level. Assume that, of the first and second connection points Vsetb and Vrstb, one connection point where the other end of the resistor R4 or R5 connected thereto, which is on the H level is an H connection point, and the other connection point where the other end of the resistor R4 or R5 connected thereto, which is on the L level is an L connection point. In this embodiment and the following embodiments, assume that one connection point connected to the L level directly or through a resistor is an L connection point, and the other connection point is an H connection point. Here, assume that the other end of the resistor 4 is on the H level, and the other end of the resistor R5 is on the L level. With reference to the potential Vsw, it is obvious that the potential Vsetb is equal to the voltage E1 and on the H level. On the other hand, the potential Vrstb takes a value (=E1·R5/(R2+R5)) obtained by dividing the voltage E1 between the resistors R2 and R5. At this time, the voltage ratio between the resistors R2 and R5 is decided in advance so that the value (=E1·R5/(R2+R5)) can be brought into the H level with respect to the transmission circuit 20, that is, made higher than a threshold voltage of the inverter INV2 serving as a threshold voltage of the transmission voltage 20 with respect to the potential Vrstb.

As for the case where the other end of the resistor R4 is on the L level and the other end of the resistor R5 is on the H level, the voltage ratio between the resistors R1 and R4 is decided in advance so that a voltage obtained by dividing the voltage E1 between the resistors R1 and R4 can be brought into the H level with respect to the transmission circuit 20. That is, the voltage ratio is set so that the voltage Vsetb=E1·R4/(R1+R4) can be made higher than a threshold voltage of the inverter constituted by the MOS transistors MP1 and MN3, that is, a threshold voltage of the transmission circuit 20 with respect to the potential Vsetb. When the voltage ratio between the resistors R1 and R4 and the voltage ratio between the resistors R2 and R5 are decided, thus, the aforementioned condition, "when the input signals $P_{ON}$=L and $P_{OFF}$=L are supplied from the outside to the high-potential-side driving circuit 10, the output of the transmission circuit 20 is high in impedance, so that the latch circuit 30 can keep holding the previous state," can be guaranteed.

Figure 2:
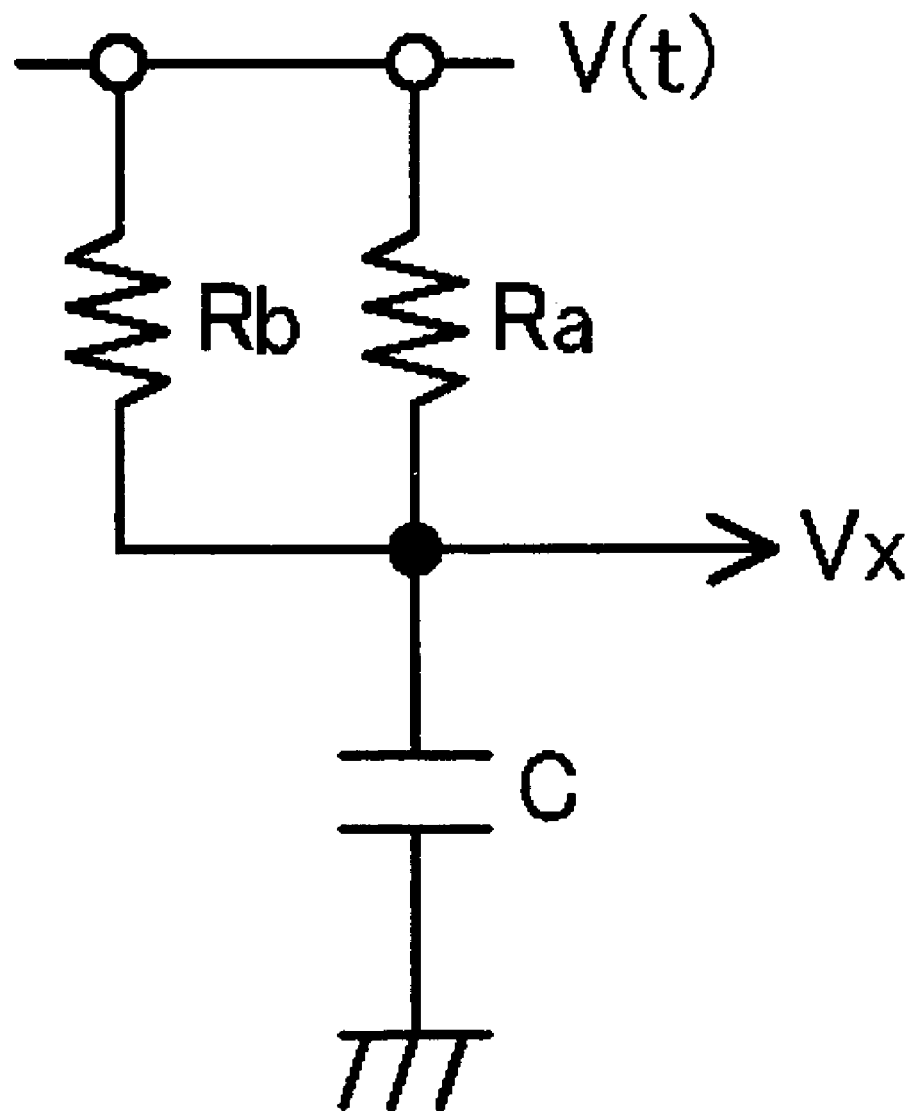
FIG. 2 is a circuit diagram showing an analytic model for an H connection point in Embodiment 1.

Next, analysis will be made about operation to be performed when dv/dt noise is generated. In this case, different models are applied to the first connection point Vsetb and the second connection point Vrstb in accordance with whether each connection point is an H connection point or an L connection point. First, consider the case of an H connection point. FIG. 2 shows an analytic model in this case.

In FIG. 2, a resistor Ra corresponds to the resistor R1 or R2, and a resistor Rb corresponds to the resistor R4 or R5. The other signs are the same as those in the analytic model shown in FIG. 22. In the same manner as in the model of FIG. 22, how the potential Vx varies when the potential V(t) increases suddenly will be analyzed on the assumption that the initial values of the potential V(t) and the potential Vx are Vo. Also in this model, the potential V(t) is expressed by Equation (3).

Figure 22:
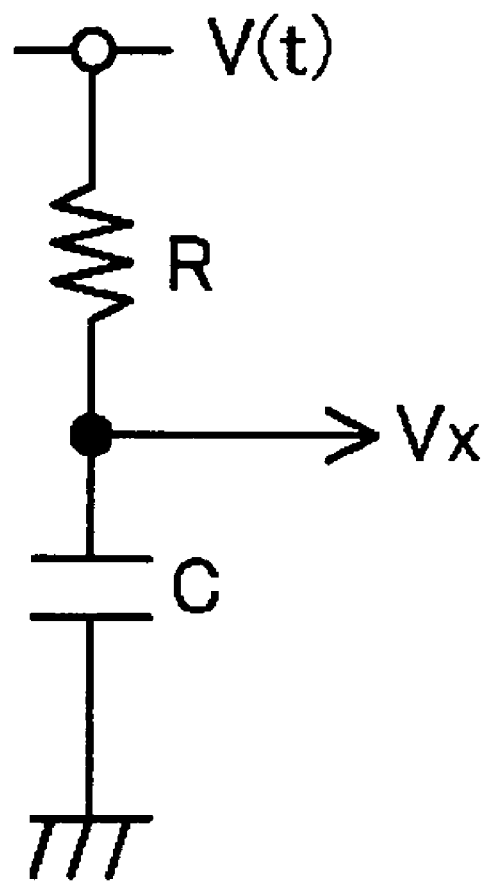
FIG. 22 is a circuit diagram showing a model for analyzing the dv/dt noise.

In FIG. 2, currents flowing in the resistors Ra and Rb are integrated by a capacitor C to vary the potential Vx. This means that the resistor R in FIG. 22 is replaced by a combined resistance of the resistors Ra and Rb connected in parallel. From this fact, the following Equation (19) can be derived in the same manner as Equation (12).

$$Vx = Vo + kt - kCRab\left(1 - \exp\left(-\frac{t}{CRab}\right)\right) \quad (19)$$

where Rab designates a combined resistance value provided by the following Equation (20).

$$Rab = \frac{RaRb}{Ra+Rb} \quad (20)$$

From this Equation, V(t)−Vx for showing dv/dt noise can be expressed by the following Equation (21).

$$V(t) - Vx = kCRab\left(1 - \exp\left(-\frac{t}{CRab}\right)\right) \quad (21)$$

Next, the operation after the potential Vb reaches Ein+E1 and becomes constant will be analyzed. When Vm designates a value corresponding to Ein+E1 and t1 designates a time when the potential V(t) reaches Vm, the following Equation (22) can be derived in the same manner as Equation (17).

$$Vx = Vm - (Vm - V1) \times \exp\left(-\frac{t-t1}{CRab}\right) \quad (22)$$

From this Equation, V(t)−Vx=Vm−Vx for showing the dv/dt noise can be expressed by the following Equation (23).

$$Vm - Vx = (Vm - V1) \times \exp\left(-\frac{t-t1}{CRab}\right) \quad (23)$$

Figure 3:
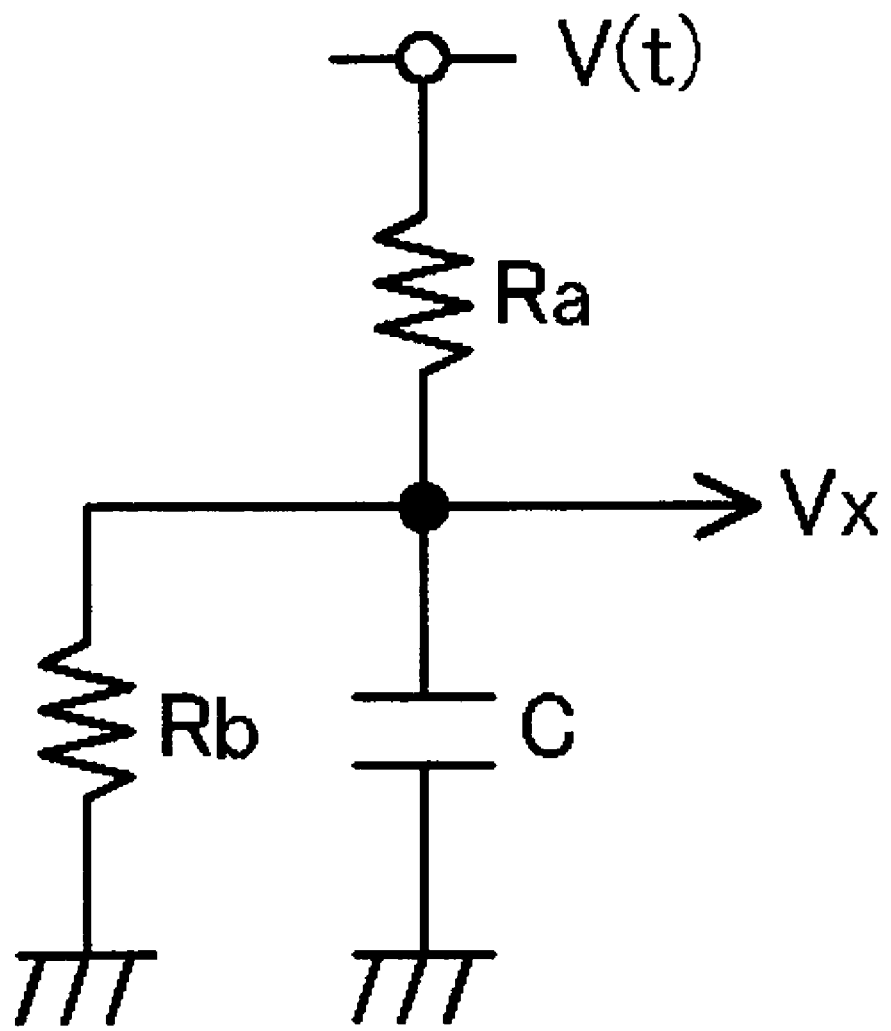
FIG. 3 is a circuit diagram showing an analytic model for an L connection point in Embodiment 1.

The case of an H connection point has been described above. Next, the case of an L connection point will be analyzed. FIG. 3 shows a model for the case. Also here, in the same manner as in the model of FIG. 22, how the potential Vx varies when the potential V(t) increases suddenly will be analyzed on the assumption that the initial values of the potential V(t) and the potential Vx are Vo. Also in this model, the potential V(t) is expressed by Equation (3).

In FIG. 3, a current flowing from the potential V(t) through the resistor Ra charges the capacitor C, and a current flowing into the potential Vsw through the resistor Rb discharges the capacitor C. A differential current between the two currents is integrated to vary the potential Vx. From the potential Vsw=Vb−E1=V(t)−Vo, the following Equation (24) can be formulated.

$$Vx = Vo + \frac{1}{C}\int\left(\frac{V(t) - Vx}{Ra} - \frac{Vx - (V(t) - Vo)}{Rb}\right)dt \quad (24)$$

Equation (24) is differentiated, and Equation (3) is substituted therein. When the obtained Equation is arranged, the following differential equation can be obtained.

$$CRab\frac{dVx}{dt} + Vx = \frac{Rb}{Ra+Rb}Vo + kt \quad (25)$$

Also here, in the same manner as in the model of FIG. 22, Equation (3) is used as V(t) to analyze how the potential Vx varies when the potential V(t) increases suddenly on the assumption that the initial values of the potential V(t) and the potential Vx are Vo. The following Equation (26) is derived from Equation (25) in the same manner as Equation (12) or Equation (19).

$$Vx = \left(\frac{Rb}{Ra+Rb}Vo + kt\right) - kCRab\left(1 - \exp\left(-\frac{t}{CRab}\right)\right) \quad (26)$$

From this Equation, V(t)-Vx for showing dv/dt noise can be expressed by the following Equation (27).

$$V(t) - Vx = \frac{Ra}{Ra+Rb}Vo + kCRab\left(1 - \exp\left(-\frac{t}{CRab}\right)\right) \quad (27)$$

Next, operation after the potential Vb reaches Ein+E1 and becomes constant will be analyzed. Also here, when Vm designates a value corresponding to Ein+E1, and t1 designates the time when the potential V(t) reaches the value Vm, the following Equation (28) is established in the same manner as Equation (24).

$$Vx = V1 + \frac{1}{C}\int\left(\frac{Vm - Vx}{Ra} - \frac{Vx - (Vm - Vo)}{Rb}\right)dt \quad (28)$$

When Equation (28) is differentiated and arranged, the following differential equation can be obtained.

$$CRab\frac{dVx}{dt} + Vx = Vm - \frac{Ra}{Ra+Rb}Vo \quad (29)$$

From this Equation, the following Equation (30) can be derived in the same manner as Equation (17) or Equation (22).

$$Vx = Vm - \frac{Ra}{Ra+Rb}Vo - \left(Vm - \frac{Ra}{Ra+Rb}Vo - V1\right) \times \exp\left(-\frac{t-t1}{CRab}\right) \quad (30)$$

From this Equation, V(t)−Vx=Vm−Vx for showing the dv/dt noise can be expressed by the following Equation (31).

$$Vm - Vx = \frac{Ra}{Ra+Rb}Vo + \left(Vm - \frac{Ra}{Ra+Rb}Vo - V1\right) \times \exp\left(-\frac{t-t1}{CRab}\right) \quad (31)$$

On the basis of the aforementioned results of analysis, description will be made about the behaviors of the potential Vestb and the potential Vrstb when dv/dt noise is generated.

Figure 23:
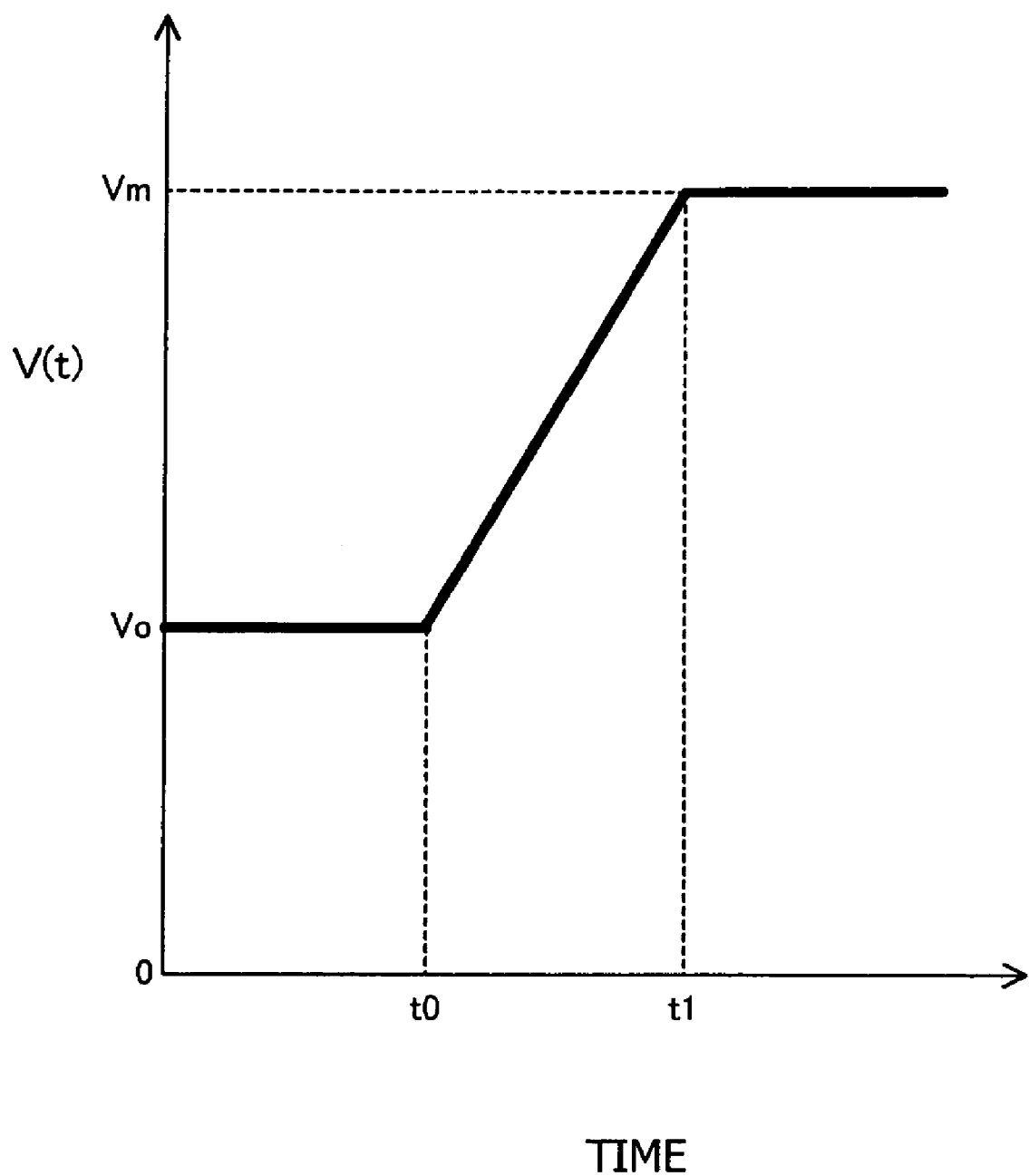
FIG. 23 is a graph showing a model of a potential V(t) showing the movement of a potential Vb.

First, at time t=t0−t1 shown in FIG. 23, the difference between the potential Vb and the potential at the H connection point of the first and second connection points Vsetb and Vrstb varies in accordance with Equation (21). On the other hand, the difference between the potential Vb and the potential at the L connection point of the first and second connection points Vsetb and Vrstb varies in accordance with Equation (27). When Equation (21) and Equation (27) are compared with each other, there is a difference of RaVo/(Ra+Rb) between the two equations. Therefore, it is proved that the potential at the L connection point drops down further relatively to the potential at the H connection point.

On and after the time t1, the difference between the potential at the H connection point and the potential Vb varies in accordance with Equation (23), and the difference between the potential at the L connection point and the potential Vb varies in accordance with Equation (31). As is understood from Equations (23) and (31), the two Equations have one and the same time constant CRab.

Further, calculate the initial values and the final values of the differences between the potentials at the first and second connection points Vsetb and Vrstb and the potential Vb using the value with t=0 in Equations (21) and (27) and the value with t=∞ in Equations (23) and (31). Thus, it is proved that the difference between the potential at the H connection point and the potential Vb starts at 0 and ends at 0, and the difference between the potential at the L connection point and the potential Vb starts at VoRa/(Ra+Rb) and ends at VoRa/(Ra+Rb).

Figure 4:
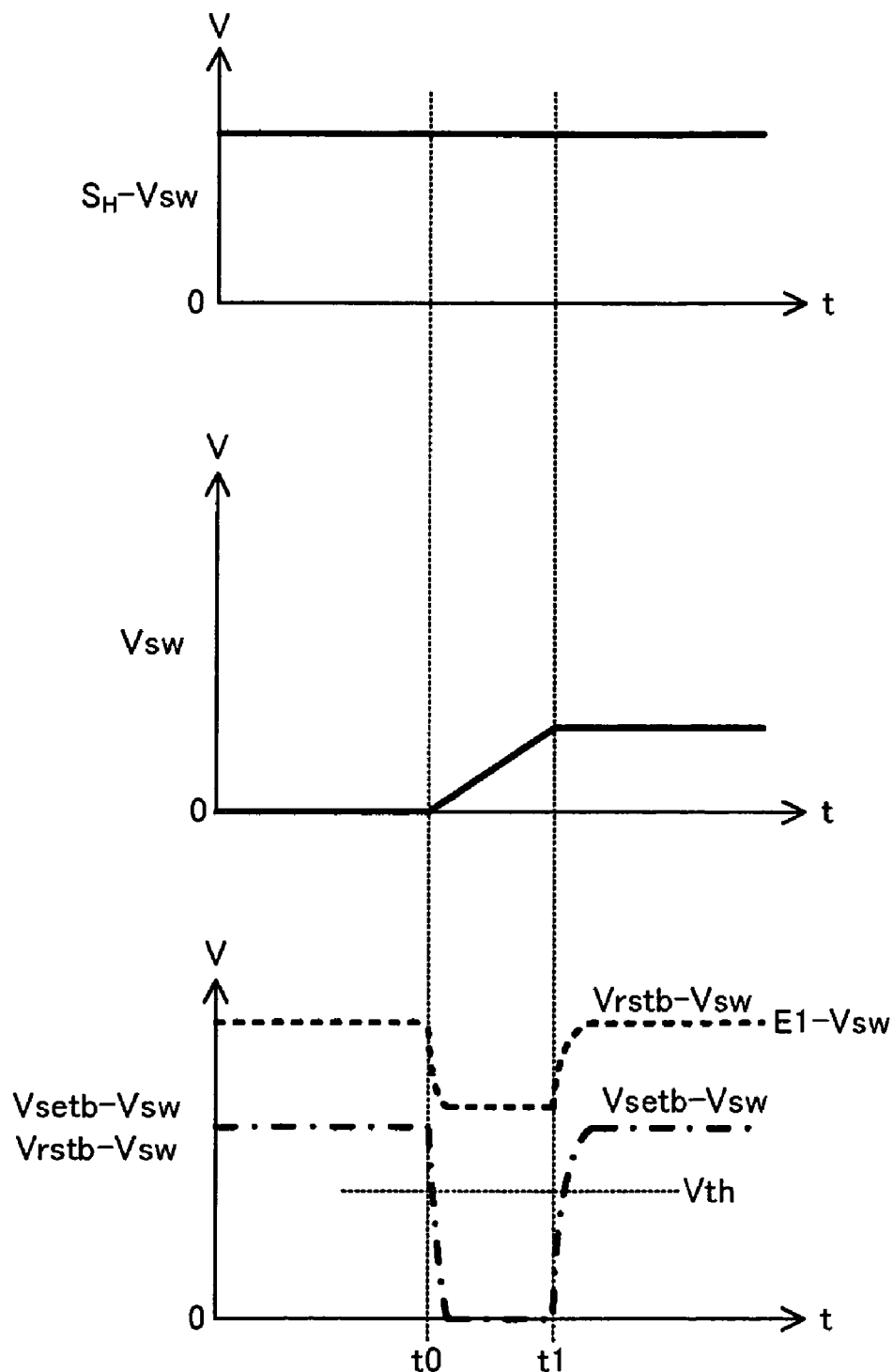
FIG. 4 is a chart for explaining the condition of changes in potential at a first connection point Vsetb and a second connection point Vrstb when dv/dt noise is generated in Embodiment 1.

On the basis of the aforementioned results, FIGS. 4, 5, and 6 show the states of changes of the potentials at the first and second connection points Vsetb and Vrstb when dv/dt noise is generated. Each of FIGS. 4, 5, and 6 is a graph showing, beginning at the top, the difference ($S_H$–Vsw) between the potential of the output $S_H$ of the latch circuit 30 and the potential Vsw, the potential Vsw, and the potentials (Vsetb–Vsw) and (Vrstb–Vsw) which are the potentials at the first and second connection points Vsetb and Vrstb using the potential Vsw as reference potential. In each of FIGS. 4, 5, and 6, the abscissa designates the time t, and Vth designates a threshold voltage of the inverter INV2 and a threshold voltage of the inverter constituted by the MOS transistors MP1 and MN3 (the threshold voltages of the both inverters do not have to be the same, but they are here set to be equal to each other for the sake of simplification of description).

FIG. 4 is a graph showing changes of the potentials at the first and second connection points Vsetb and Vrstb when the output $S_H$ of the latch circuit 30 is on the H level and a constant k showing the magnitude of the dv/dt noise is small. Since the output $S_H$ is on the H level, the first connection point Vsetb is an L connection point, and the second connection point Vrstb is an H connection point. Since the constant k is small, the potential Vrstb does not drop down to the threshold voltage Vth or lower, but only the potential Vsetb drops down to the threshold voltage Vth or lower. This means that the latch circuit 30 can be always set to keep $S_H$=H even if dv/dt noise is generated.

FIG. 5 is a graph showing changes of the potentials at the first and second connection points Vsetb and Vrstb when the output $S_H$ of the latch circuit 30 is on the L level and the constant k showing the magnitude of the dv/dt noise is small. Since the output $S_H$ is on the L level, the first connection point Vsetb is an H connection point, and the second connection point Vrstb is an L connection point. Since the constant k is small, the potential Vsetb does not drop down to reach the threshold voltage Vth or lower, but only the potential Vrstb drops down to the threshold voltage Vth or lower. This means that the latch circuit 30 can be always reset to keep $S_H$=L even if dv/dt noise is generated.

FIG. 6 is a graph showing changes of the potentials at the first and second connection points Vsetb and Vrstb when the output $S_H$ of the latch circuit 30 is on the H level and the constant k showing the magnitude of the dv/dt noise is large. Since the constant k is large, that is, since the dv/dt noise is great, both the potential at the first connection point Vsetb and the potential at the second connection point Vrstb drops down to the threshold voltage Vth or lower. Due to the effect of the diodes D1 and D2 (the forward voltages of the diodes D1 and D2 are ignored), the differences (Vrstb–Vsw) and (Vsetb–Vsw) can be prevented from dropping down to zero or lower.

When both the potential at the first connection point Vsetb and the potential at the second connection point Vrstb drop down to the threshold value Vth or lower, the output of the transmission circuit 20 is made high in impedance as described previously, so that the data of the latch circuit 30 can be protected. From comparison between Equation (20) and Equation (26) and comparison between Equation (22) and Equation (30), the potential at the first connection point Vsetb is always lower than the potential at the second connection point Vrstb (except the case where the both connection points are clamped by the diodes D1 and D2 so as to make the potentials of the both connection points equal to each other). Accordingly, the potential at the first connection point Vsetb drops down to the threshold voltage Vth earlier than the potential at the second connection point Vrstb, and then rises up to the threshold voltage Vth later than the potential at the second connection point Vrstb. That is, there is no case where only the potential at the second connection point Vrstb drops down to the threshold voltage Vth or lower. Thus, the latch circuit 30 is prevented from being reset. On the contrary, when the potentials at the first and second connection points Vsetb and Vrstb rise up, the latch circuit 30 is set again to keep $S_H$=H even if dv/dt noise is generated. Similarly, when the output $S_H$ of the latch circuit 30 is on the L level, the relation $S_H$=L is held even if high dv/dt noise is generated. That is, according to this embodiment, the state (data) of the latch circuit 30 can be kept regardless of the magnitude of the dv/dt noise.

In addition, some resistance (one of R1, R2, combined resistance of R1 and R4, and combined resistance of R2 and R5) is connected between each of the first and second connection points Vsetb and Vrstb and the potential Vb. Accordingly, there is no fear that the potential Vb and the ground potential are short-circuited to allow a short-circuit current to flow therebetween.

Embodiment 2

In the level shift circuit according to Embodiment 1, as described above, the potential at the L connection point drops down to the threshold voltage Vth earlier than the potential at the H connection point and then rises up to the threshold voltage Vth later than the potential at the H connection point. Thus, the state of the latch circuit 30 can be kept. With increase in time difference between the time when the potential at the H connection point becomes equal to the threshold voltage Vth and the time when the potential at the L connection point becomes equal to the threshold voltage Vth, a large margin can be secured for preventing malfunction caused by dv/dt noise. A level shift circuit according to Embodiment 2 is to increase the time difference, as will be described below with reference to the drawings.

Figure 7:
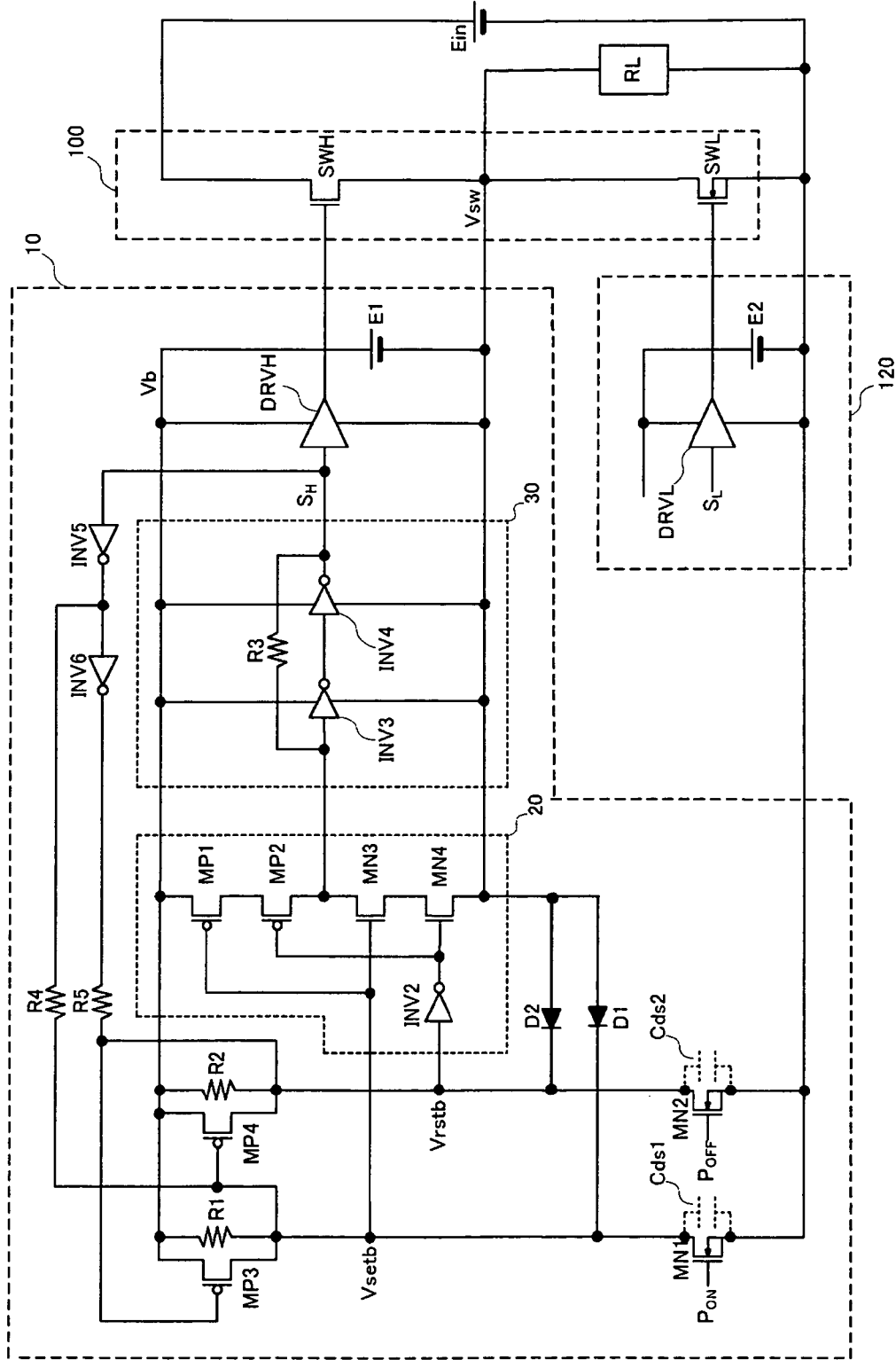
FIG. 7 is a circuit diagram showing a second embodiment (Embodiment 2) of a half-bridge circuit using a level shift circuit according to the invention.

FIG. 7 shows a second embodiment of a half-bridge circuit using a level shift circuit according to the invention. Parts which can be shared with those in FIG. 1 are referred to by the same numerals correspondingly, and detailed description thereof will be omitted. The half-bridge circuit shown in FIG. 7 is the same as the configuration of FIG. 1, except that P-channel MOS transistors MP3 and M94 are connected in parallel with the resistors R1 and R2 forming the first and second resistor circuits respectively, the connection point between the resistors R1 and R4 is connected to a gate of the P-channel MOS transistor MP4, and the connection point between the resistors R2 and R5 is connected to a gate of the P-channel MOS transistor MP3. That is, the gate of each P-channel MOS transistor MP3, MP4 is connected to an H connection point or an L connection point. According to this embodiment, the inverters INV5 and INV6, the resistors R4 and R5 and the P-channel MOS transistors MP3 and MP4 form a feedback circuit. Referring to the models in FIGS. 2 and 3, assume that the relation of R1=R2=Ra is established as to the resistance values of the resistors R1 and R2, and the relation of R4=R5=Rb is established as to the resistance values of the resistors R4 and R5. When the on resistance of each P-channel MOS transistor MP3, MP4 is ignored once in this case, the gate-to-source voltage of the P-channel MOS transistor whose gate is connected to the H connection point is zero, and the gate-to-source voltage of the P-channel MOS transistor whose gate is connected to the L connection point is expressed by E1·Ra/(Ra+Rb). When the value E1·Ra/(Ra+Rb) is set to be slightly larger than the threshold voltage of each P-channel MOS transistor MP3, MP4, the MOS transistor whose gate is connected to the L connection point has a finite on resistance Ron. This on resistance Ron is connected in parallel with the resistor R1 or R2. For example, assume that E1 is 15V, the threshold voltage of each P-channel MOS transistor MP3, MP4 is 2.5 V, R1=R2=Ra is 10 kΩ, and R4=R5=Rb is 0.45 kΩ. In this case, the value E1·Ra/(Ra+Rb) is 2.7 V, which is 0.2 V larger than the threshold voltage.

As described above, the value E1·Ra/(Ra+Rb) serving as the gate-to-source voltage of the MOS transistor is close to the threshold voltage of the P-channel MOS transistor MP3, MP4. Accordingly, the resistance Ron has a finite value which is not zero. Thus, there is no fear that a through current flows between the potential Vb and the ground potential even when the N-channel MOS transistor MN1 or MN2 connected to the H connection point is turned on.

Figure 8:
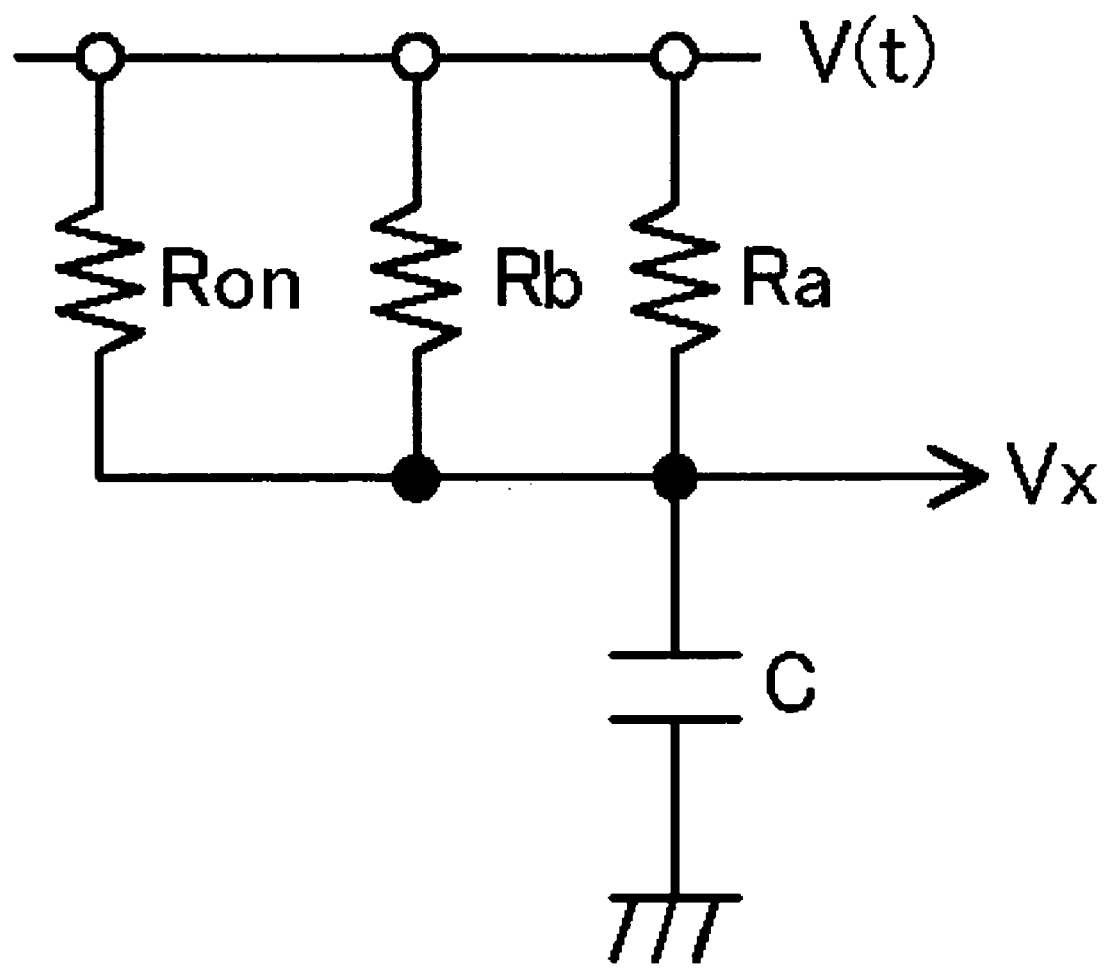
FIG. 8 is a circuit diagram showing an analytic model for an H connection point in Embodiment 2.

FIG. 8 shows a model in the case where the on resistance Ron of the MOS transistor whose gate is connected to the L connection point is connected in parallel with the resistor R1 or R2. FIG. 8 is the same as FIG. 2, except that the resistor Ron is added. When the gate of the MOS transistor connected in parallel with the resistor Ra is connected to the L connection point, the other end of the resistor Rb is on the H level. That is, the model shown in FIG. 8 serves for the H connection point. On the other hand, the gate of the MOS transistor whose drain is connected to the L connection point is connected to the H connection point. Since the MOS transistor is turned off, the MOS transistor can be ignored. Accordingly, the model for the L connection point is the same as that in FIG. 3.

As is also apparent from FIG. 8, since the resistor Ron is added in parallel to the resistors Ra and Rb connected between the H connection point of the potential Vx and the potential V(t), the combined resistance value Rabon=RaRbRon/(RaRb+RbRon+RonRa) between the H connection point and the potential point V(t) is smaller than the resistance value Rab shown in Equation (20). When the resistance value Rab in Equations (26), (27), (30) and (31) describing the behavior of the potential Vx at the H connection point in Embodiment 1 is replaced by the smaller resistance value Rabon, those Equations can be used as equations describing the operation of this model.

On the other hand, the resistor Ron has nothing to do with the L connection point. Accordingly, Equations (19), (21), (22), and (23) derived in Embodiment 1 can be applied directly to description of the behavior of the L connection point. That is, the resistance value Rab appearing in those equations is also used in Embodiment 2 as it is. That is, a time constant CRabon in the equations describing the behavior of the H connection point is smaller than a time constant CRab for the L connection point. Thus, the potential at the H connection point varies more quickly than the potential at the L connection point. Such a state is shown in FIG. 9.

Figure 9:
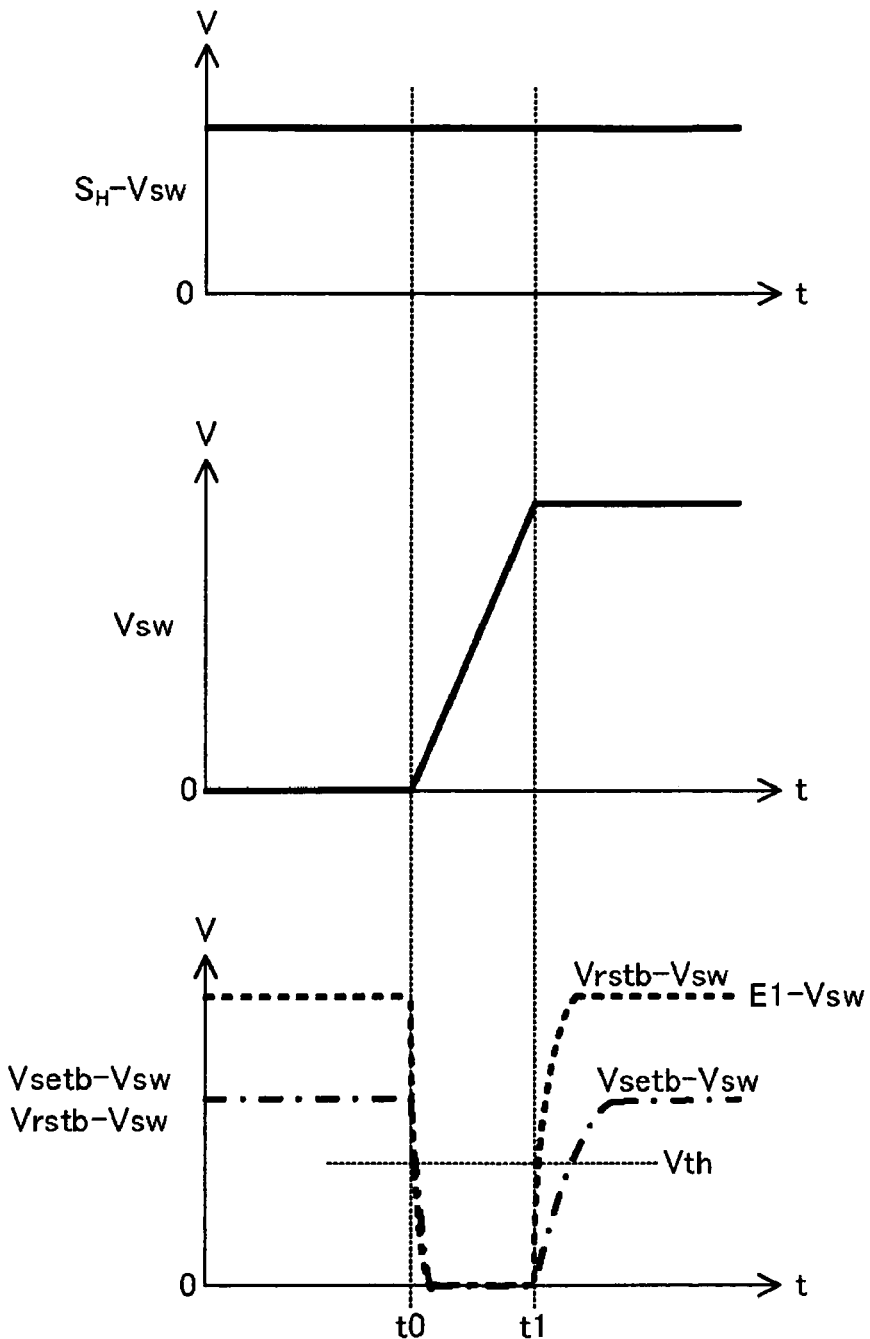
FIG. 9 is a chart for explaining the condition of changes in potential at a first connection point Vsetb and a second connection point Vrstb when dv/dt noise is generated in Embodiment 2.

FIG. 9 is a graph showing changes of the potentials at the first and second connection points Vsetb and Vrstb when the output $S_H$ of the latch circuit 30 is on the H level and the constant k showing the magnitude of the dv/dt noise is large. Since the constant k is large, that is, since the dv/dt noise is high, both the potential at the first connection point Vsetb and the potential at the second connection point Vrstb drop down to the threshold voltage Vth or lower. On this occasion, due to the difference in time constant as described above, the potential (Vsetb−Vsw) corresponding to the H connection point varies more quickly than the potential (Vrstb−Vsw) corresponding to the L connection point. Accordingly, when the two potentials rise up, the time difference between the time when one becomes equal to the threshold voltage Vth and the time when the other becomes equal to the threshold voltage Vth increases so that the latch circuit 30 can be finally set or reset to keep its original value. Thus, malfunction caused by the dv/dt noise can be prevented surely.

As for the case where the output $S_H$ of the latch circuit 30 is on the L level, the potentials (Vsetb−Vsw) and (Vrstb−Vsw) are merely replaced by each other. Therefore, description of the case will be omitted.

Embodiment 3

In the level shift circuit according to Embodiment 1 or 2 shown in FIG. 1 or 7, one of the resistors R4 and R5 which is connected to the L connection point forms a series circuit with the resistor R1 or R2. The series circuit is connected between the power supply line Vb and the connection point Vsw so that a current can always flow therein. When dv/dt noise is generated, the potentials at the first and second connection points Vsetb and Vrstb must be restored to their original states as quickly as possible. To this end, the resistance values of the resistors R1 to R4 must be lowered. However, when the resistance values of the resistors R1 to R4 are lowered, the current flowing between the power supply line Vb and the connection point Vsw through the resistors increases. Thus, increase in current consumption may be a problem. A level shift circuit according to Embodiment 3 can deal with the increase in current consumption.

Figure 10:
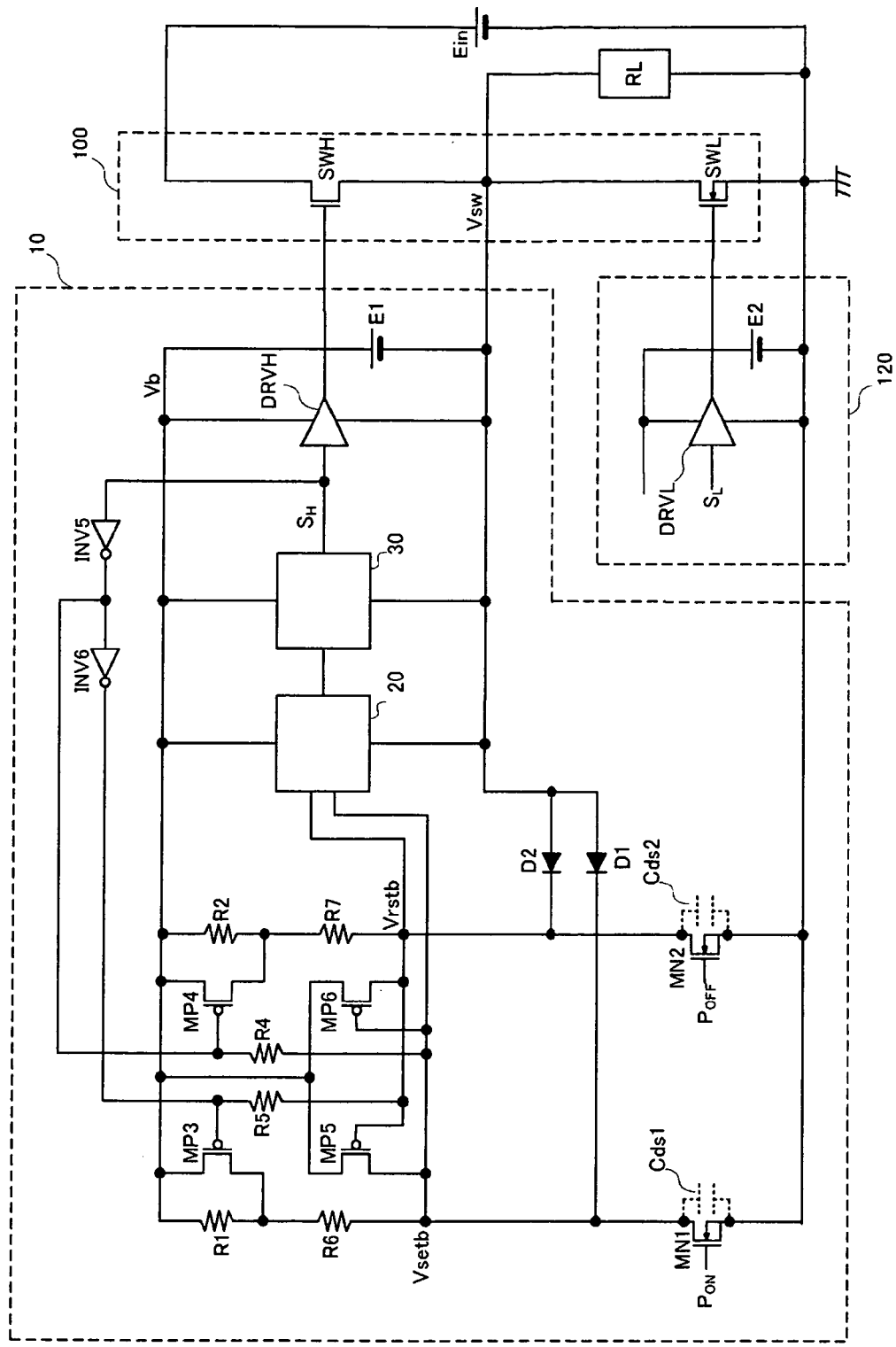
FIG. 10 is a circuit diagram showing a third embodiment (Embodiment 3) of a half-bridge circuit using a level shift circuit according to the invention.
Figure 11:
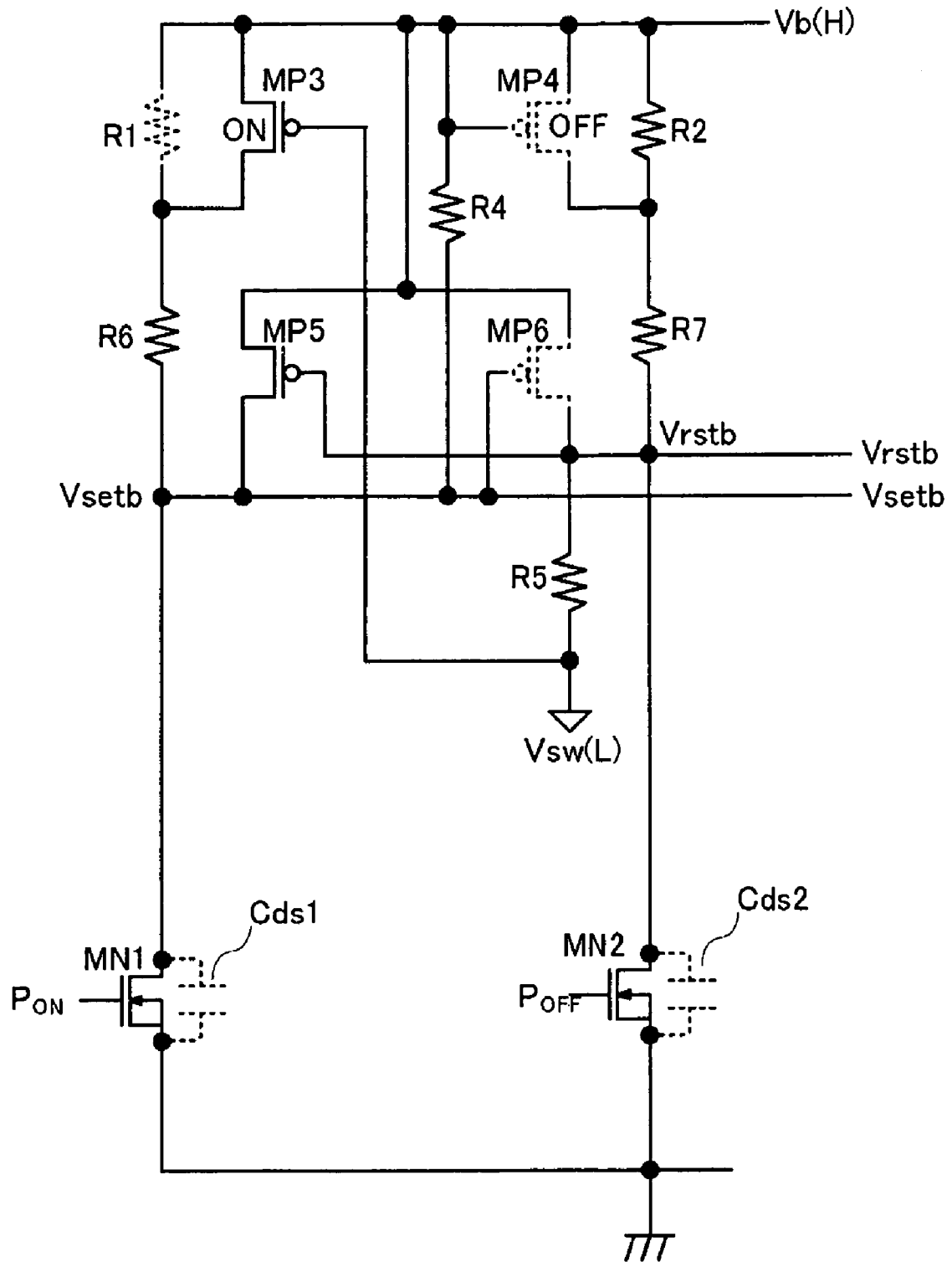
FIG. 11 is a circuit diagram for explaining the operation of the level shift circuit in Embodiment 3.

FIG. 10 shows a third embodiment of a half-bridge circuit using a level shift circuit according to the invention. Parts which can be shared with those in FIG. 1 or 7 are referred by the same numerals correspondingly, and detailed description thereof will be omitted. In the half-bridge circuit shown in FIG. 10, the first resistor circuit is constituted by a series circuit of resistors R1 and R6, and the second resistor circuit is constituted by a series circuit of resistors R2 and R7. P-channel MOS transistors MP3 and MP4 are connected in parallel with the resistors R1 and R2 respectively. Output terminals of inverters INV6 and INV5 are connected to gate terminals of the P-channel MOS transistors MP3 and MP4 respectively. A source terminal of a P-channel MOS transistor MP5 is connected to the power supply line Vb, a drain terminal thereof is connected to the first connection point Vsetb, and a gate terminal thereof is connected to an output terminal of the inverter INV6 through the second connection point Vrstb and the resistor R5. A source terminal of a P-channel MOS transistor MP6 is connected to the power supply line Vb, a drain terminal thereof is connected to the second connection point Vrstb, and a gate terminal thereof is connected to an output terminal of the inverter INV5 through the first connection point Vsetb and the resistor R4. In this embodiment, differently from Embodiment 2, the gates of the P-channel MOS transistors MP3 and MP4 are connected directly to the inverters INV6 and INV5 and not through any resistor. In this embodiment, the inverters INV5 and INV6, the resistors R4 to R7 and the P-channel MOS transistors MP3 to MP6 form a feedback circuit. The operation of the level shift circuit according to this embodiment will be described with reference to FIG. 11. FIG. 11 shows an equivalent circuit of a portion for deciding the potentials at the first and second connection points Vsetb and Vrstb when the latch circuit 30 is reset to bring its output $S_H$ into the L level, that is, when the first connection point Vsetb serves as an H connection point due to the H-level output of the inverter INV5 while the second connection point Vrstb serves as an L connection point due to the L-level output of the inverter INV6.

In FIG. 11, the resistor R1 and the P-channel MOS transistors MP4 and MP6 shown by the broken lines are negligible devices. That is, as for the resistor R1, the gate potential of the P-channel MOS transistor MP3 corresponds to the potential Vsw (L level) to turn on the P-channel MOS transistor MP3 perfectly. Thus, the opposite terminals of the resistor R1 are short-circuited. On the other hand, the gate potential of each P-channel MOS transistor MP4, MP6 corresponds to the potential Vb (H level) to turn off the P-channel MOS transistor MP4, MP6 perfectly. Thus, the P-channel MOS transistors MP4 and MP6 can be regarded as nonexistent substantially.

The circuit state of FIG. 11 will be described on the assumption that the pulse signals $P_{ON}$ and $P_{OFF}$ are on the L level to turn off the N-channel MOS transistors MN1 and MN2 (the same rule will be applied to the following cases unless otherwise stated). All the devices connected to the first connection point Vsetb serve to pull the first connection point Vsetb up to the potential Vb. Thus, the potential at the first connection point Vsetb corresponds to the potential Vb. That is, the first connection point Vsetb serves as an H connection point. Since the first connection point Vsetb is on the H level, the P-channel MOS transistor MP6 is off. As a result, the potential difference between the second connection point Vrstb and the potential Vsw corresponds to a voltage obtained by dividing the potential difference between the potential Vb and the potential Vsw by the series circuit of the resistors R2 and R7 and the resistor R5. Since the potential at the second connection point Vrstb is supplied to the gate terminal of the P-channel MOS transistor MP5, the P-channel MOS transistor MP5 has a finite on resistance between its source and drain. The first connection point Vsetb is pulled up to the potential Vb by a parallel resistance of the on resistance and the resistor R6.

The magnitude of a current Ileak flowing from the potential Vb to the potential Vsw through resistors will be compared between Embodiment 2 and Embodiment 3. First, in Embodiment 2, set R1=R2=10 kΩ and R4=R5=45 kΩ in consideration of the threshold voltage of each P-channel MOS transistor MP3, MP4. In addition, set Vb−Vsw=10V. When the second connection point Vrstb is an L connection point in the same manner as in the aforementioned description about Embodiment 3, the magnitude of the current Ileak is 10/(10,000+45,000)=0.181 A=181 mA.

In Embodiment 3, assume that the resistance value of the resistor R6, which is a main resistor for pulling the first connection point Vsetb serving as an H connection point up to the potential Vb, is 10 kΩ in the same manner as the resistor R1 (which is also a main resistor for pulling the first connection point Vsetb up to the potential Vb and which dominates transient characteristic) in Embodiment 2. On the other hand, the ratio between the series resistance of the resistors R2 and R7 and the resistance of the resistor R5 should be decided in consideration of the threshold voltage of each P-channel MOS transistor MP5, MP6. Therefore, even if the resistance value of the resistor 7 is determined (the resistance value of the resistor 7 is made equal to the resistance value of the resistor R6 so as to produce no difference between response to the pulse signal $P_{ON}$ and response to the pulse signal $P_{OFF}$), the resistance values of the resistors R2 and R5 can be adjusted to increase the resistance value of the series resistance of the resistors R2, R7, and R4 for deciding the current Ileak. On the assumption that (R2:R5 in Embodiment 2)=10:45=((R2+R7):R5 in Embodiment 3) is established, the resistance value between the potential Vb and the potential Vsw is made 10 times as large as that in Embodiment 2. Thus, R2=90 kΩ and R5=450 kΩ are obtained. In this case, the current Ileak is 18.1 mA. Thus, the current consumption can be reduced on a large scale.

In this state, consider transient response when dv/dt noise is generated. A model of the first connection point Vsetb when dv/dt noise is generated is the same as the model of FIG. 8, and the first connection point Vsetb behaves in accordance with the result of analysis in the model of FIG. 8. On the other hand, a model of the second connection point Vrstb when dv/dt noise is generated is the same as the model of FIG. 3, and the second connection point Vrstb behaves in accordance with the result of analysis in the model of FIG. 3.

In Equations (27) and (31) showing the behavior of dv/dt noise in the model of FIG. 3, the values of the resistors Ra and Rb deciding the combined resistance Rab are 10 times as large as those in Embodiment 2 respectively (Ra corresponds to R2 in Embodiment 2, and Ra corresponds to R2+R7 in Embodiment 3, while Rb is R5 in Embodiments 2 and 3). Thus, the value of the combined resistance Rab is also 10 times as large, and the time constant is also 10 times as large. Accordingly, when dv/dt noise is generated in the state where the latch circuit 30 has been reset, the transient characteristic of the second connection point Vrstb in Embodiment 3 becomes slower than that in Embodiment 2.

On the other hand, in the model of FIG. 8, of the values of the resistors Ra, Rb, and Ron deciding the combined resistance Rabon, the two resistors Ra (10 kΩ) and Ron (on resistance of P-channel MOS transistor) have the same value or almost the same value, and the resistor Rb has a larger value than the resistors Ra and Ron so that the magnitude of the combined resistance Rabon obtained by parallel connection of the three resistors is substantially equal to that in Embodiment 2 or 3. Accordingly, it is proved that the transient characteristic of the first connection point Vsetb in Embodiment 3 is almost equal to that in Embodiment 2 when dv/dt noise is generated in the state where the latch circuit 30 has been reset. Thus, when dv/dt noise is generated in the state where the latch circuit 30 has been reset, the response of the second connection point Vrstb is slower than that in Embodiment 1 or 2. That is, the second connection point Vrstb keeps the L level longer than the first connection point Vsetb so that the reset state can be kept more easily than in Embodiment 1 or 2.

The same description as the above description can be applied to the case where the latch circuit 30 is set to bring its output $S_H$ into the H level, that is, the case where the first connection point Vsetb serves as an L connection point due to the L-level output of the inverter INV5 and the second connection point Vrstb serves as an H connection point due to the H-level output of the inverter INV 6. Therefore, detailed description thereof will be omitted. In this case, when dv/dt noise is generated, the first connection point Vsetb keeps the L level longer than the second connection point Vrstb so that the set state can be kept more easily than in Embodiment 1 or 2.

It is apparent from the above description, according to Embodiment 3, the current consumption is small, and the state of the latch circuit 30 can be kept easily.

Embodiment 4

Figure 12:
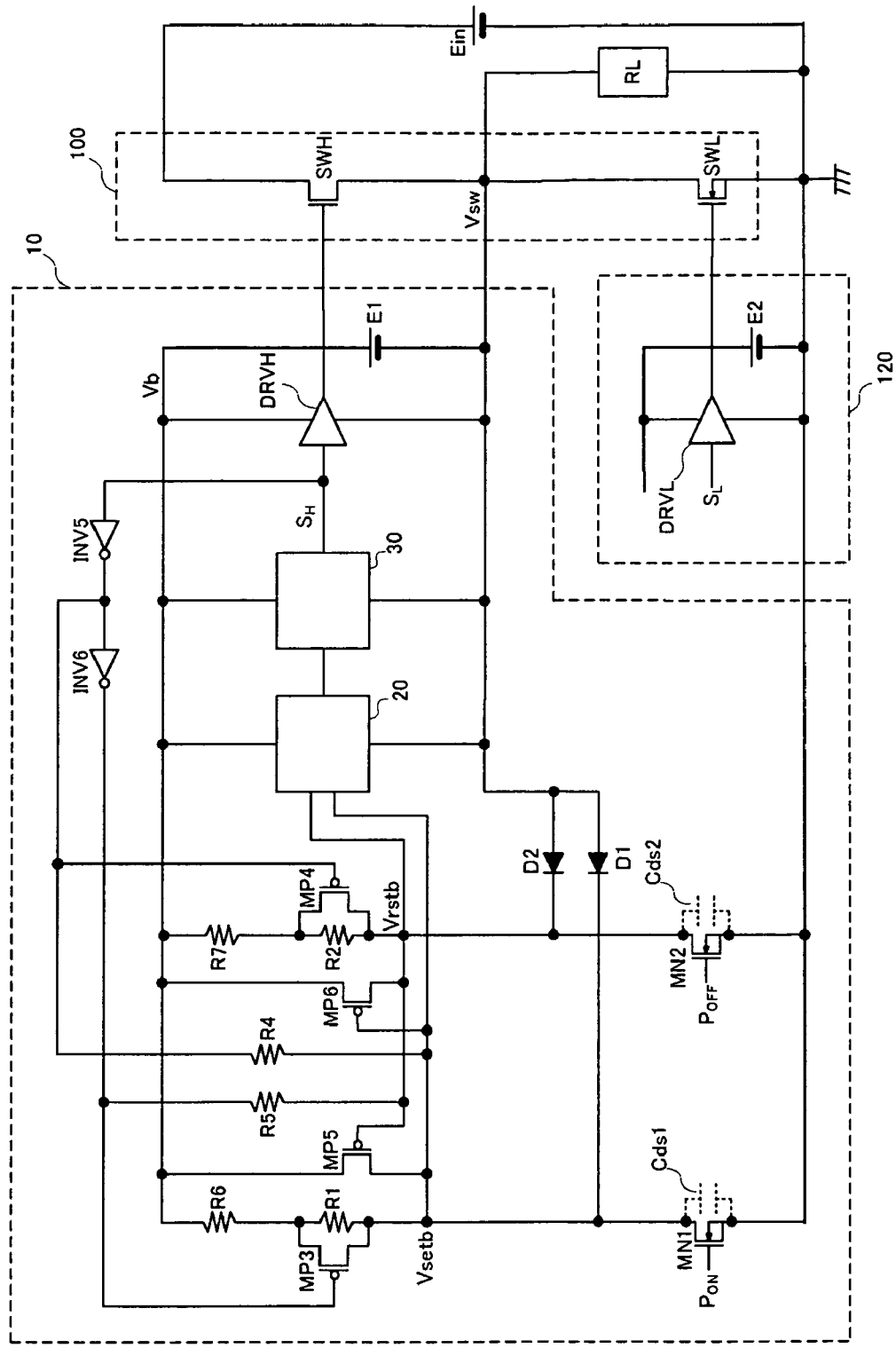
FIG. 12 is a circuit diagram showing a fourth embodiment (Embodiment 4) of a half-bridge circuit using a level shift circuit according to the invention.

FIG. 12 shows a fourth embodiment of a half-bridge circuit using a level shift circuit according to the invention. The fourth embodiment shown in FIG. 12 is a modification of Embodiment 3 shown in FIG. 10. In the fourth embodiment, the connection relationship between the parallel circuit of the resistor R1 and the P-channel MOS transistor MP3 and the resistor R6, and the connection relationship between the parallel circuit of the resistor R2 and the P-channel MOS transistor MP4 and the resistor R7 are reversed. In addition, FIG. 13 shows an equivalent circuit of a portion which decides the potential at the first connection point Vsetb and the potential at the second connection point Vrstb when the latch circuit 30 is reset to bring its output $S_H$ into the L level.

Figure 13:
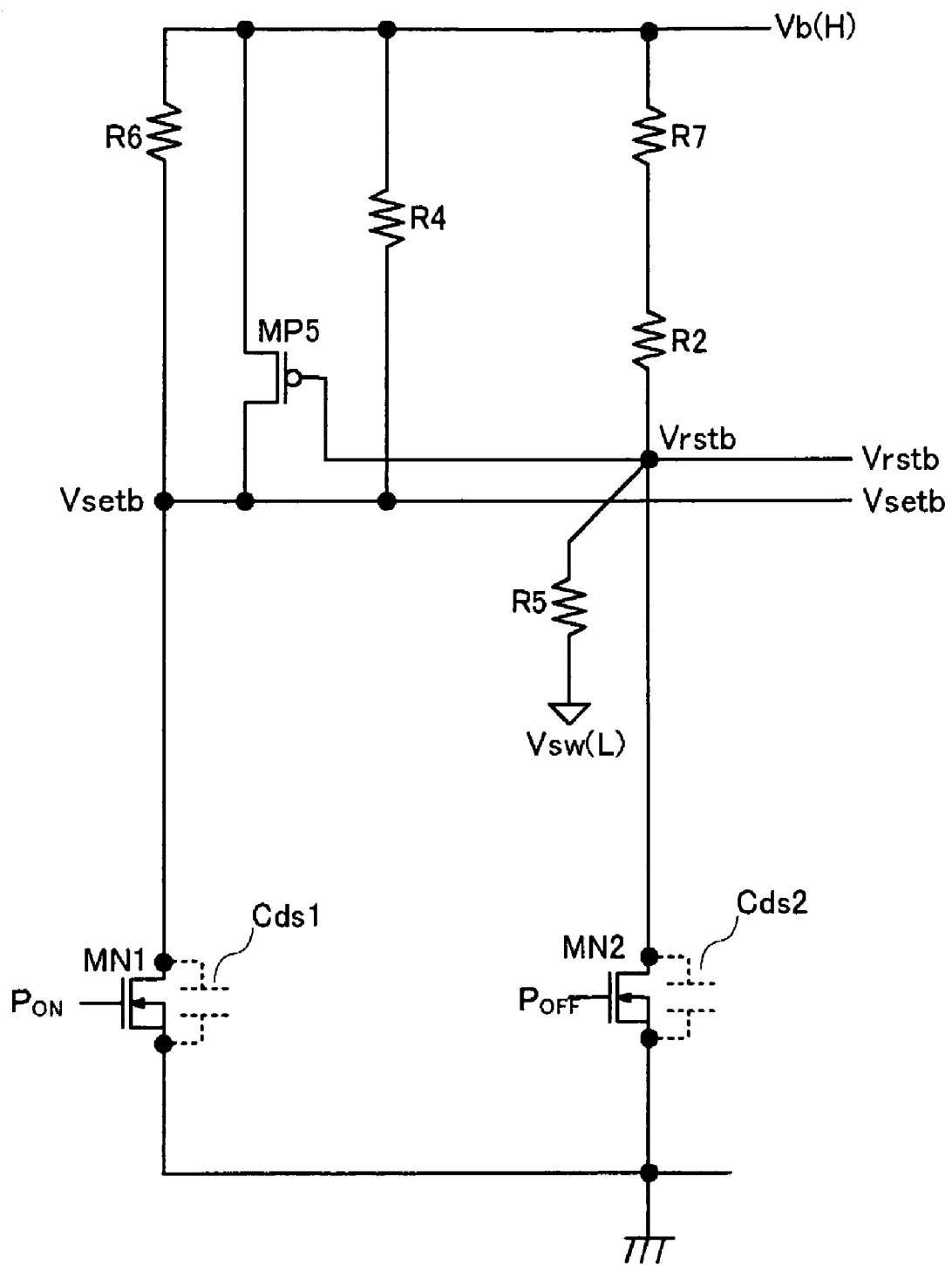
FIG. 13 is a circuit diagram showing an equivalent circuit of a portion for deciding potential at a first connection point Vsetb and potential at a second connection point Vrstb when a latch circuit 30 is reset to bring its output into an L level in Embodiment 4.

FIG. 13 is substantially equivalent to FIG. 11. As is apparent from this fact, the function and operation of the circuit shown in FIG. 12 is the same as that in FIG. 10. Therefore, detailed description about Embodiment 4 will be omitted.

Figure 14:
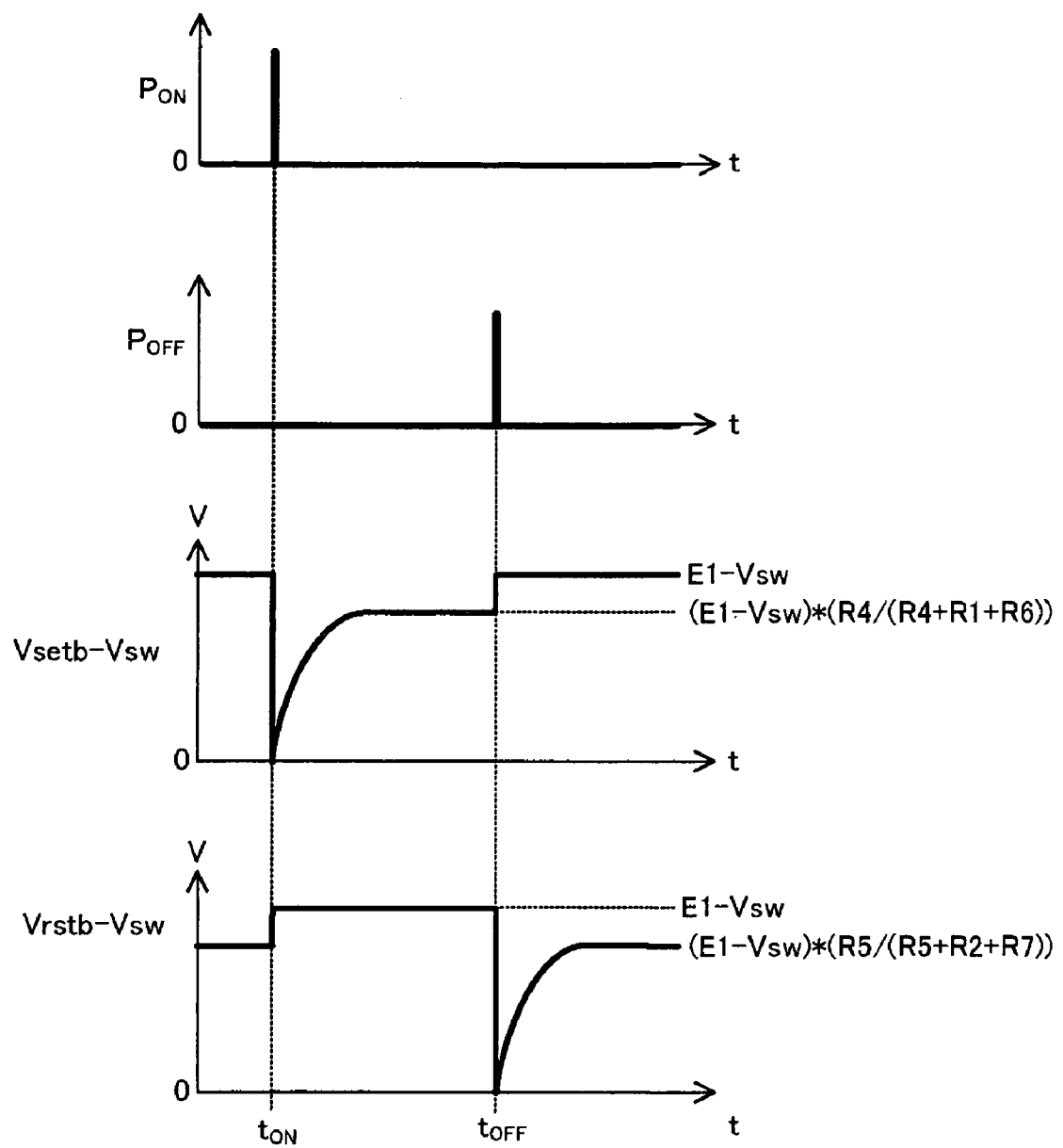
FIG. 14 is a chart showing responses of potential differences (Vsetb−Vsw) and (Vrstb−Vsw) between the connection point Vsw and the first and second connection points Vsetb and Vrstb when an input signal $P_{ON}$=H or $P_{OFF}$=H is inputted in Embodiment 3 or 4.

FIG. 14 shows responses of potential differences (Vsetb−Vsw) and (Vrstb−Vsw) between the first and second connection points Vsetb and Vrstb and the connection point Vsw when the input signals $P_{ON}$=H and $P_{OFF}$=H are inputted in each Embodiment 3, 4. Without dv/dt noise, there is no case that the input signals $P_{ON}$ and $P_{OFF}$ are brought into the H level concurrently. When the input signal $P_{ON}$=H is inputted, the first connection point Vsetb serves as an L connection point. When the input signal $P_{OFF}$=H is inputted, the second connection point Vrstb serves as an L connection point. An operation model for the L connection point is the same as FIG. 3 in the same manner as in the description about dv/dt noise in Embodiment 3. The L connection point behaves in accordance with the result of analysis in the model of FIG. 3. As described in Embodiment 3, the resistors Ra and Rb in the model of FIG. 3 take values Ra=R1+R6 and Rb=R4 (when the first connection point Vsetb serves as the L connection point) or Ra=R2+R7 and Rb=R5 (when the second connection point Vrstb serves as the L connection point). Here, when the resistors R1, R2 and R4 to R7 take the same resistance values as those described in Embodiment 3, the time constant defining the response of the L connection point is 10 times as large as that in Embodiment 2.

Embodiment 5

In Embodiment 3 or 4, the magnitudes of resistance values of the resistors R5 and R6 can be suppressed to keep the response speed of the H connection point while the resistance values of the resistors R1, R2, R4, and R5 can be increased to reduce the current consumption. However, the response of the L connection point is slowed with increase of the resistance values of the resistors R1, R2, R4, and R5. Accordingly, Embodiment 3 or 4 is not suitable for applications needing high speed operation. In addition, as shown in FIG. 14, the potential at the L connection point corresponds to an intermediate potential between power sources (Vb(H) and Vsw (L)) of next-stage circuits to which the first connection point Vsetb or the second connection point Vrstb is supplied. Accordingly, there is a possibility that setting of the voltage ratio (R4/(R4+R1+R6), R5/(R5+R2+R7)) may lead to a leak current (through current) flowing into the next-stage circuits.

Figure 15:
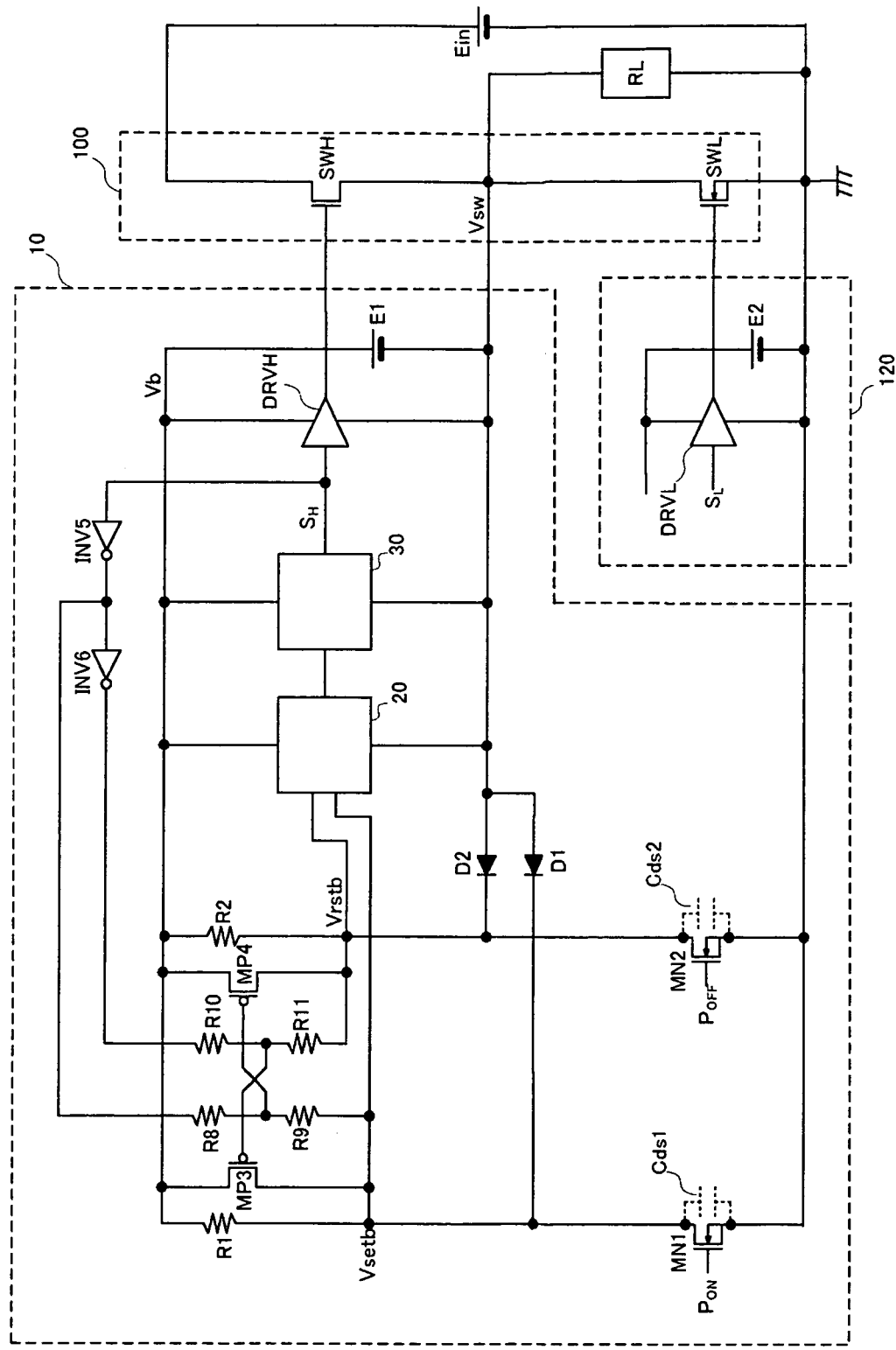
FIG. 15 is a circuit diagram showing a fifth embodiment (Embodiment 5) of a half-bridge circuit using a level shift circuit according to the invention.
Figure 16:
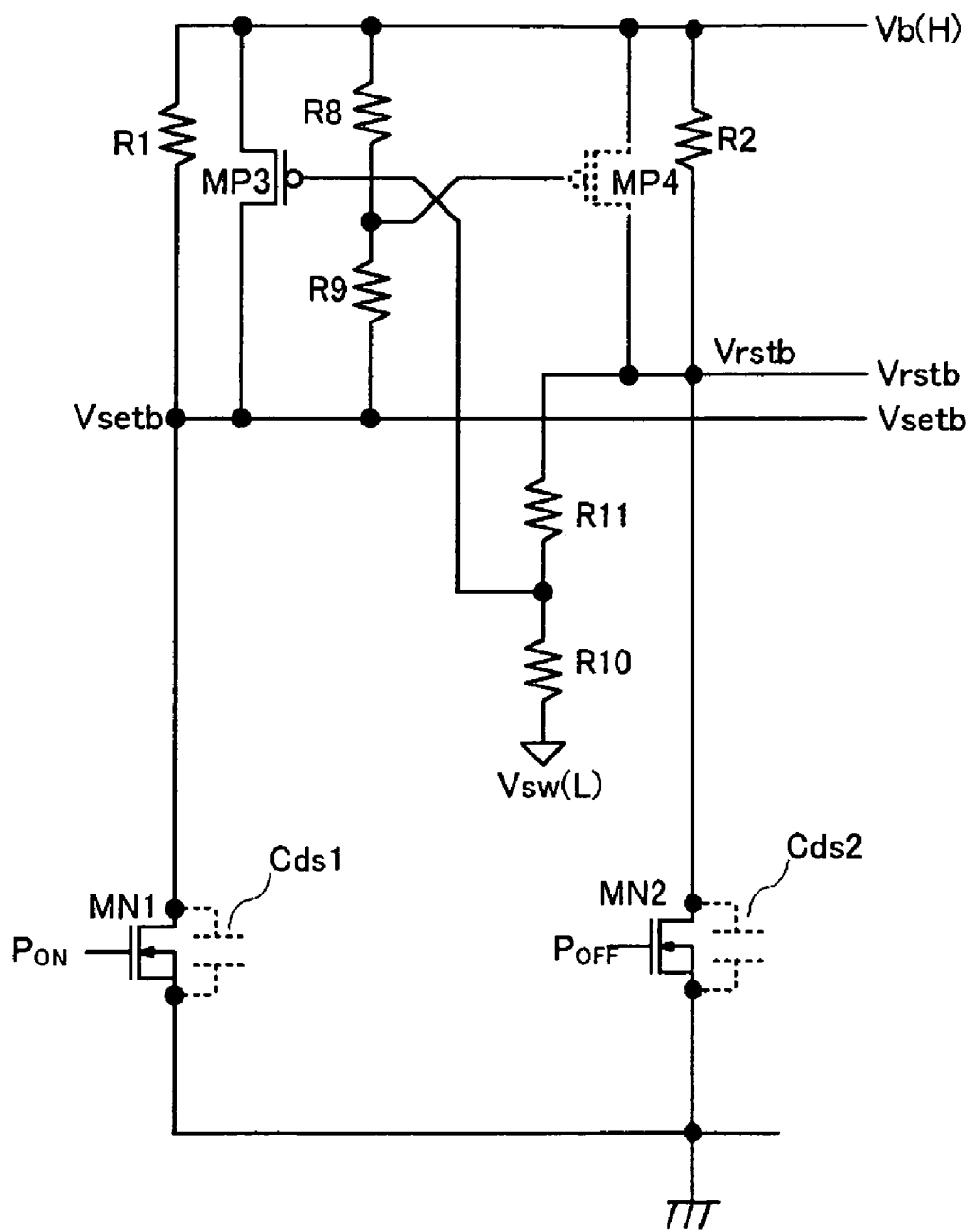
FIG. 16 is a circuit diagram for explaining the operation of the level shift circuit in Embodiment 5.

A fifth embodiment of a half-bridge circuit using a level shift circuit according to the invention as shown in FIG. 15 is to improve these problems. In FIG. 15, parts which can be shared with those in FIG. 1, 7, 10, or 12 are referred to by the same numerals correspondingly, and detailed description thereof will be omitted. In the half-bridge circuit shown in FIG. 15, the first resistor circuit is constituted by a resistor R1, and the second resistor circuit is constituted by a resistor R2. P-channel MOS transistors MP3 and MP4 are connected in parallel to the resistors R1 and R2 respectively. An output terminal of an inverter INV5 is connected to a first connection point Vsetb through resistors R8 and R9 connected in series. An output terminal of an inverter INV6 is connected to a second connection point Vrstb through resistors R10 and R11 connected in series. In addition, a connection point between the resistors R8 and R9 is connected to a gate terminal of the P-channel MOS transistor MP4, and a connection point between the resistors R10 and R11 is connected to a gate terminal of the P-channel MOS transistor MP3. In this embodiment, the inverters INV5 and INV6, the resistors R8 to R11 and the P-channel MOS transistors MP3 and MP4 form a feedback circuit. The operation of the level shift circuit according to this embodiment will be described with reference to FIG. 16. FIG. 16 shows an equivalent circuit of a portion for deciding the potential at the first connection point Vsetb and the potential at the second connection point Vrstb when the latch circuit 30 is reset to bring its output $S_H$ into the L level, that is, when the output of the inverter INV5 is on the H level and the output of the inverter INV6 is on the L level.

The circuit state of FIG. 11 will be described also here on the assumption that the N-channel MOS transistors MN1 and MN2 are turned off due to the L-level input signals $P_{ON}$ and $P_{OFF}$. First, all the devices connected to the first connection point Vsetb serve to pull the first connection point Vsetb up to the potential Vb. Thus, the potential at the first connection point Vsetb corresponds to the potential Vb. That is, the first connection point Vsetb serves as an H connection point. Therefore, the P-channel MOS transistor MP4 shown by the broken line in FIG. 16 is a negligible device. That is, since the potential at the first connection point. Vsetb corresponds to the potential Vb (H level), the gate potential of the P-channel MOS transistor MP4 also corresponds to the potential Vb (H level). Thus, the P-channel MOS transistor MP4 is perfectly off, and can be regarded as nonexistent substantially.

Since the P-channel MOS transistor MP4 is off, the potential difference between the second connection point Vrstb and the potential Vsw corresponds to a voltage obtained by dividing the potential difference between the potential Vb and the potential Vsw by the resistor R2 and the series circuit of the resistors R11 and R10. As will be described later, the voltage ratio (R11+R10)/(R2+R11+R10) is set at a value close to 1. Accordingly, the potential at the second connection point Vrstb is substantially equal to the potential Vb. As a result, there is no fear that a leak current is generated in the next-stage circuits to which the potential at the second connection point Vrstb is supplied. Although the potential at the second connection point Vrstb is close to the potential Vb, the potential at the second connection point Vrstb is lower than the potential Vb. Thus, the second connection point Vrstb serves as an L connection point. The potential difference between the potential Vsw and the potential at a connection point between the resistors R10 and R11 corresponding to the gate potential of the P-channel MOS transistor MP3 is obtained by dividing the potential difference between the potential Vb and the potential Vsw by the series circuit of the resistors R10 and R11 and the resistor R2. Therefore, on resistance with a finite resistance value is provided between the source and the drain of the P-channel MOS transistor MP3. The first connection point Vsetb is pulled up to the potential Vb by a parallel resistance of the on resistance, the resistor R1 and the series circuit of the resistors R8 and R9.

Comparison will be made between Embodiment 2 and Embodiment 5 as to the magnitude of the current Ileak flowing from the potential Vb to the potential Vsw through resistors. First, in Embodiment 2, R1=R2=10 kΩ and R4=R5=45 kΩ are set in consideration of the threshold voltage of each P-channel MOS transistor MP3, MP4. In addition, Vb−Vsw=10V is set. When the second connection point Vrstb is an L connection point in the same manner as in the above description about Embodiment 5, the magnitude Ileak is 10/(10,000+45,000)=0.181 A=181 mA.

In Embodiment 5, first, assume that the resistance values of the resistors R1 and R2 are 10 kΩ in the same manner as the resistors R1 and R2 in Embodiment 2. On the other hand, the ratio between the series resistance of the resistors R10 and R11 and the resistance of the resistor R2 or the ratio between the series resistance of the resistors R8 and R9 and the resistance of the resistor R1 should be decided in consideration of the threshold voltage of each P-channel MOS transistor MP3, MP4. Even if the resistance values of the resistors R1 and R2 are determined, the resistance values of the resistors R8 to R11 can be adjusted to increase the resistance values of the resistor R2, the series resistance of the resistors R11 and R10, the resistor R1 and the series resistance of the resistors R8 and R9 for deciding the current Ileak. On the assumption that (R2:R5 in Embodiment 2)=10:45=((R10+R11):R2 in Embodiment 5) is established, the resistance value between the potential Vb and the potential Vsw is made 10 times as large as that in Embodiment 2. Thus, R11=90 kΩ and R10=450 kΩ are obtained. In the same manner, R9=90 kΩ and R8=450 kΩ are obtained. In this case, the current Ileak is 18.1 mA. Thus, the current consumption can be reduced on a large scale. In addition, on this occasion, the voltage ratio (R11+R10)/(R2+R11+R10) is 0.98, which is a value close to 1 as described previously.

Figure 17:
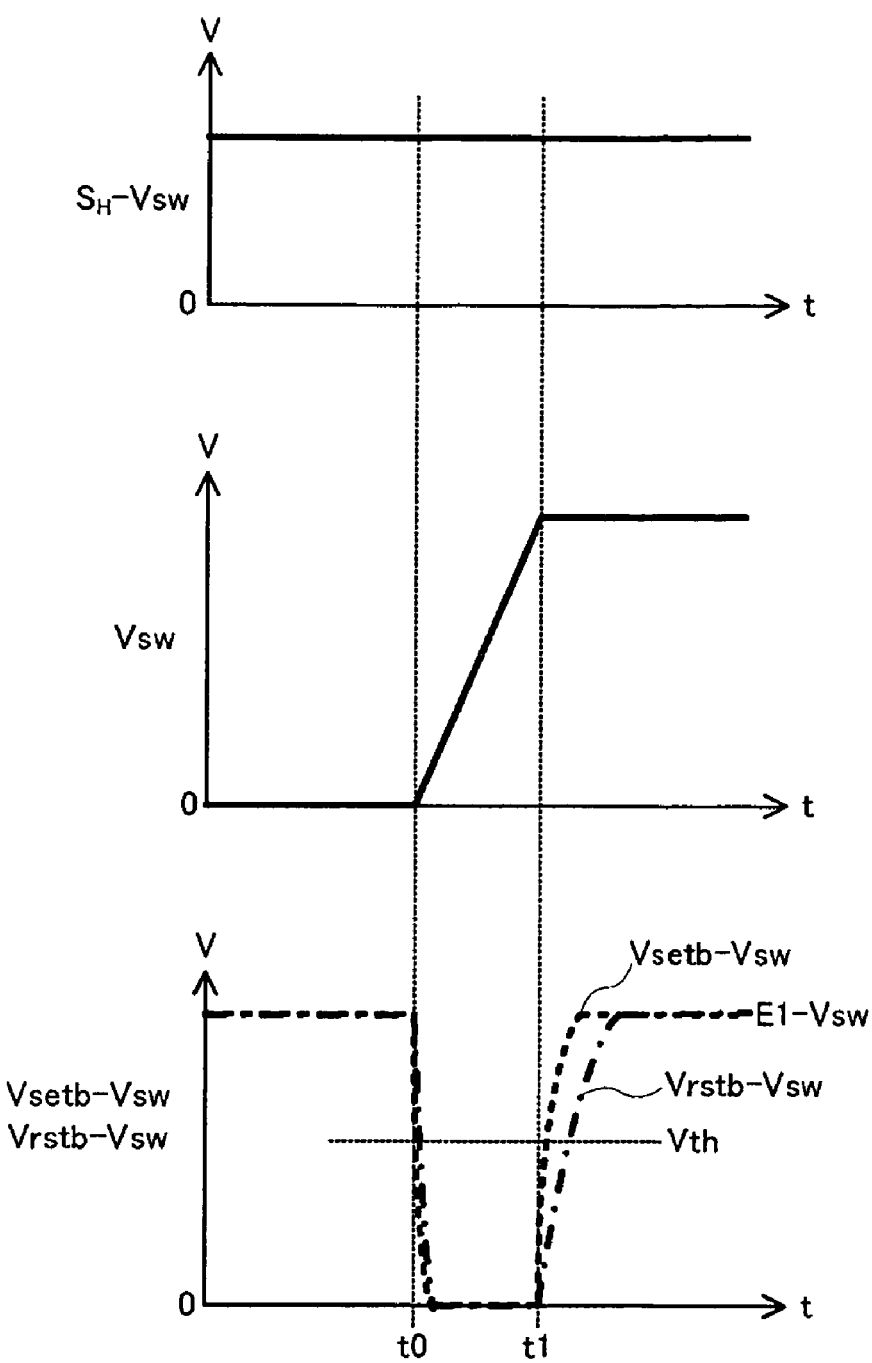
FIG. 17 is a chart for explaining transient responses when dv/dt noise is generated in Embodiment 5.

With reference to FIG. 17, description will be made about transient response when dv/dt noise is generated in this state. A model of the first connection point Vsetb, when dv/dt noise is generated, is the same as the model of FIG. 8, and the first connection point Vsetb behaves in accordance with the result of analysis in the model of FIG. 8. On the other hand, a model of the second connection point Vrstb, when dv/dt noise is generated, is the same as the model of FIG. 3, and the second connection point Vrstb behaves in accordance with the result of analysis in the model of FIG. 3.

In Equations (27) and (31) showing the behavior of dv/dt noise in the model of FIG. 3, the value of the resistor Ra deciding the combined resistance Rab is set as Ra=10 kΩ in the same manner as in Embodiment 2. In addition, the resistor Rb is expressed by R10+R11=540 kΩ. Due to the relation Ra<Rb, the value of the combined resistance Rab is substantially equal to Ra (accurately 9.8 kΩ). The time constant is also substantially equal to that in Embodiment 2

On the other hand, in the model of FIG. 8, of the resistance values of the resistors Ra, Rb and Ron deciding the combined resistance Rabon, the two resistors Ra (R1=10 kΩ) and Ron (on resistance of P-channel MOS transistor) have the same value or almost the same value, and the resistor Rb has a larger value (R8+R9=540 kΩ) than the resistors Ra and Ron. Thus, the magnitude of the combined resistance Rabon of the three resistors connected in parallel in Embodiment 5 is substantially equal to that in Embodiment 2. Accordingly, when dv/dt noise is generated in the state where the latch circuit 30 has been reset, the transient characteristics of the first and second connection points Vsetb and Vrstb in this embodiment are close to those in Embodiment 2, and the second connection point Vrstb can keep a low voltage longer. As a result, when dv/dt noise is generated in the state where the latch circuit 30 has been reset, the latch circuit 30 can keep the reset state.

The same operation is performed in the case where the latch circuit 30 is set to bring its output $S_H$ into the H level, that is, the case where the output of the inverter INV 5 is on the L level and the output of the inverter INV6 is on the H level. Therefore, detailed description thereof will be omitted. In this case, if dv/dt noise is generated in the latch circuit 30 when it has been set, the first connection point Vsetb keeps a low voltage state longer so that the latch circuit 30 can keep the set state.

Figure 18:
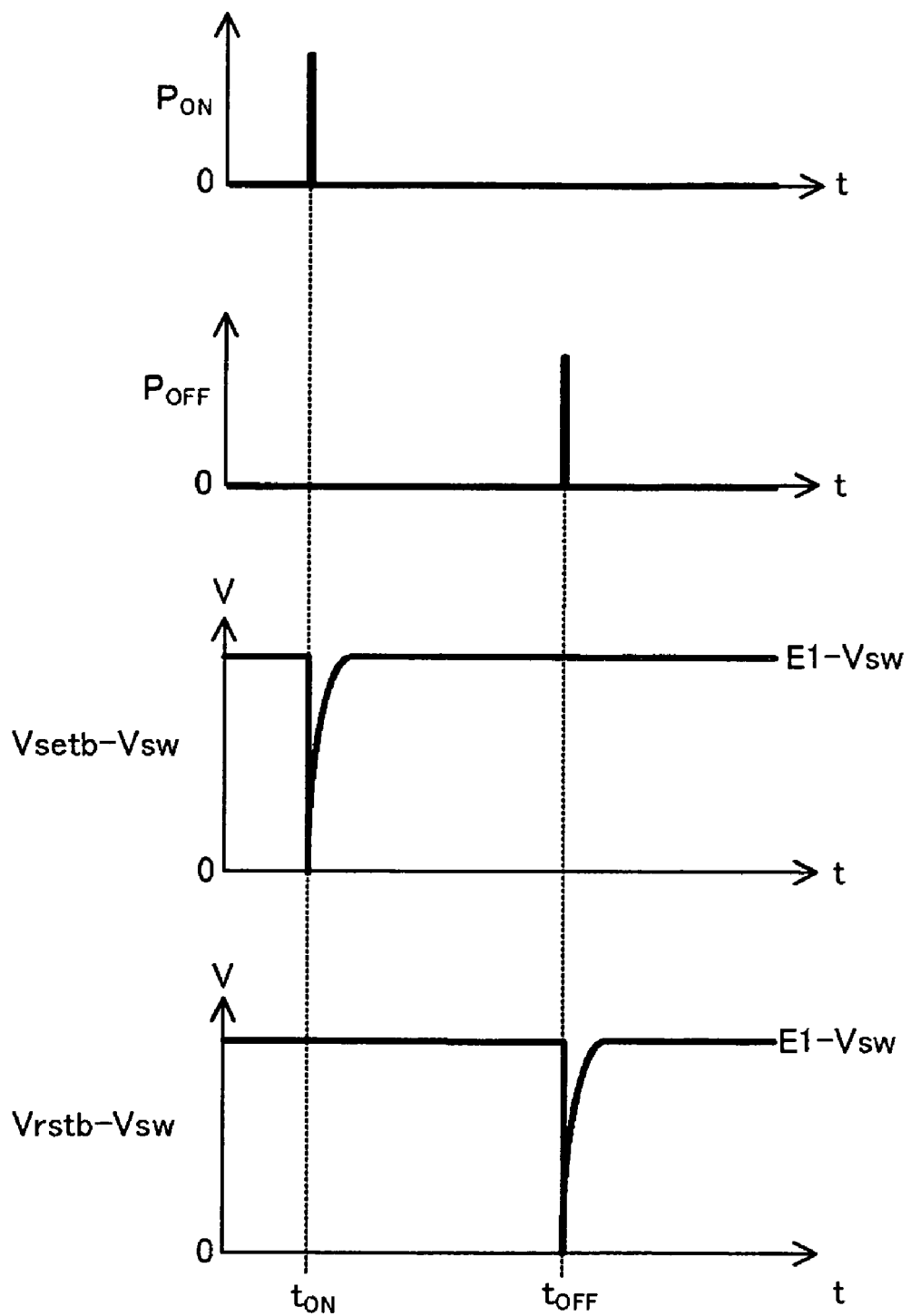
FIG. 18 is a chart showing responses of potential differences (Vsetb−Vsw) and (Vrstb−Vsw) between the connection point Vsw and the first and second connection points Vsetb and Vrstb when an input signal $P_{ON}$=H or $P_{OFF}$=H is inputted in Embodiment 5.

In addition, FIG. 18 shows responses of potential differences (Vsetb−Vsw) and (Vrstb−Vsw) between the first and second connection points Vsetb and Vrstb and the connection point Vsw when the input signals $P_{ON}$=H and $P_{OFF}$=H are inputted in Embodiment 5. The responses are improved far better than those in Embodiment 3 or 4 shown in FIG. 14. The responses are suitable for high speed operation.

According to this embodiment, malfunction caused by dv/dt noise can be dealt with in the same manner as in Embodiment 2, and the current consumption can be reduced on a larger scale than in Embodiment 2. In addition, this embodiment can be suitably applied to high speed operation without slowing the response of the L connection point in accordance with reduction in the current consumption as in Embodiment 3 or 4. Further, there is no fear that the potential at the L connection point is an intermediate potential between power sources (Vb (H) and Vsw (L)) of next-stage circuits to which the first connection point Vsetb or the second connection point Vrstb is supplied. Thus, there is no fear that a leak current (through current) flows into the next-stage circuits. Tables 2 and 3 show calculated resistance values of respective resistors in each requirement specification for the current consumption of the resistors R1, R2 and R8 to R11 on the assumption that the voltage (Vb−Vsw) is 10 V, and the resistance ratio ((R1+R9):R8 and (R2+R11):R10) deciding the malfunction tolerance on dv/dt noise. Table 2 shows the resistance values when the resistance ratio is 10:45. Table 3 shows the resistance values when the resistance ratio is 5:50.

TABLE 2

| Current Consumption | Resistance Value | | |
|---|---|---|---|
| Specification | R1, R2 | R9, R11 | R8, R10 |
| 5 µA | 10 kΩ | 353 kΩ | 1636 kΩ |
| 10 µA | 10 kΩ | 171 kΩ | 818 kΩ |

TABLE 3

| Current Consumption | Resistance Value | | |
|---|---|---|---|
| Specification | R1, R2 | R9, R11 | R8, R10 |
| 5 µA | 5 kΩ | 176 kΩ | 1818 kΩ |
| 10 µA | 5 kΩ | 85 kΩ | 909 kΩ |
| 20 µA | 5 kΩ | 40 kΩ | 454 kΩ |

The disclosure of Japanese Patent Application No. 2010-143826 is incorporated herein as a reference.

While the invention has been explained with reference to the specific embodiments of the invention, the explanation is illustrative and the invention is limited only by the appended claims.

What is claimed is:

1. A level shift circuit for transmitting an input signal from a primary-side potential system to a system operating in a secondary-side potential system different from the primary-side potential system, the level shift circuit comprising:
   a first series circuit which includes a first resistor circuit and a first switching device connected between a high-potential-side power supply potential of the secondary-side potential system and a low-potential-side power supply potential of the primary-side potential system;
   a second series circuit which includes a second resistor circuit and a second switching device connected between the high-potential-side power supply potential of the secondary-side potential system and the low-potential-side power supply potential of the primary-side potential system;
   a transmission circuit which operates in the secondary-side potential system and has a first input and a second input, the first input having a potential at a first connection point which is a connection point between the first resistor circuit and the first switching device of the first series circuit, the second input having a potential at a second connection point which is a connection point between the second resistor circuit and the second switching device of the second series circuit;

a memory device which operates in the secondary-side potential system and to which an output of the transmission circuit is supplied; and a feedback circuit which pulls one of the first and second connection points up to the high-potential side power supply potential of the secondary-side potential system and pulls the other down to the low-potential-side power supply potential of the secondary-side potential system in accordance with an output of the memory device;

wherein signals of the primary-side potential system for controlling on/off of the first and second switching devices are supplied to the first and second switching devices respectively, and the transmission circuit transmits a signal decided based on the first and second inputs to the memory device when only one of the first and second switching devices is turned on while the transmission circuit does not transmit the signal decided based on the first and second inputs to the memory device when the first and second inputs of the transmission circuit turn on the first and second switching devices concurrently or become in the same state as the on-state.

2. A level shift circuit according to claim 1, wherein the first resistor circuit includes a first resistor;

the second resistor circuit includes a second resistor; and the feedback circuit includes a third resistor having one end connected to the first connection point and the other end to which an inversion signal of the memory device is applied, and a fourth resistor having one end connected to the second connection point and the other end to which a non-inverting signal of the memory device is applied.

3. A level shift circuit according to claim 2, wherein the transmission circuit provides high impedance for an output thereof when the first and second inputs of the transmission circuit turn on the first and second switching devices concurrently or become in the same state as the on-state.

4. A level shift circuit according to claim 3, wherein the transmission circuit includes an inversion device, a P-channel MOS transistor series circuit having first and second P-channel MOS transistors connected in series, and an N-channel MOS transistor series circuit having first and second N-channel MOS transistors connected in series;

the P-channel MOS transistor series circuit and the N-channel MOS transistor series circuit are connected in series between the high-potential-side power supply potential and the low-potential-side power supply potential in the secondary-side potential system;

the first connection point is connected to gates of the first P-channel MOS transistor and the first N-channel MOS transistor;

the second connection point is connected to an input terminal of the inversion device;

an output terminal of the inversion device is connected to gates of the second P-channel MOS transistor and the second N-channel MOS transistor; and a connection point between the P-channel MOS transistor series circuit and the N-channel MOS transistor series circuit is connected to a data input terminal of the memory device.

5. A level shift circuit according to claim 4, wherein the memory device includes a buffer circuit with a resistor connected between an input and an output of the buffer circuit.

6. A level shift circuit according to claim 5, wherein the buffer circuit includes two inversion devices connected in series.

7. A level shift circuit according to claim 2, further comprising:

a third P-channel MOS transistor connected in parallel with the first resistor; and a fourth P-channel MOS transistor connected in parallel with the second resistor;

wherein a gate of the third P-channel MOS transistor is connected to a connection point between the second resistor and the fourth resistor, and a gate of the fourth P-channel MOS transistor is connected to a connection point between the first resistor and the third resistor.

8. A level shift circuit according to claim 7, wherein a voltage ratio between the first resistor and the third resistor is configured to be decided so that a potential at the first connection point when the inversion signal of the memory device serves as the low-potential-side power supply potential of the secondary-side potential system while the first switching device is off can be located between a potential obtained by subtracting a threshold voltage of the fourth P-channel MOS transistor from the high-potential-side power supply potential of the secondary-side potential system and a potential obtained by adding a threshold voltage of the transmission circuit for the potential at the first connection point to the low-potential-side power supply potential of the secondary-side potential system; and the voltage ratio between the first resistor and the third resistor is configured to be decided so that the potential at the second connection point when the non-inverting signal of the memory device serves as the low-potential-side power supply potential of the secondary-side potential system while the second switching device is off can be located between a potential obtained by subtracting a threshold voltage of the third P-channel MOS transistor from the high-potential-side power supply potential of the secondary-side potential system and a potential obtained by adding a threshold voltage of the transmission circuit for the potential at the second connection point to the low-potential-side power supply potential of the secondary-side potential system.

9. A level shift circuit according to claim 7, wherein the transmission circuit provides high impedance for an output thereof when the first and second inputs of the transmission circuit turn on the first and second switching devices concurrently or become in the same state as the on-state.

10. A level shift circuit according to claim 9, wherein the transmission circuit includes an inversion device, a P-channel MOS transistor series circuit having first and second P-channel MOS transistors connected in series, and an N-channel MOS transistor series circuit having first and second N-channel MOS transistors connected in series;

the P-channel MOS transistor series circuit and the N-channel MOS transistor series circuit are connected in series between the high-potential-side power supply potential and the low-potential-side power supply potential in the secondary-side potential system;

the first connection point is connected to gates of the first P-channel MOS transistor and the first N-channel MOS transistor;

the second connection point is connected to an input terminal of the inversion device;

an output terminal of the inversion device is connected to gates of the second P-channel MOS transistor and the second N-channel MOS transistor; and a connection point between the P-channel MOS transistor series circuit and the N-channel MOS transistor series circuit is connected to a data input terminal of the memory device.

11. A level shift circuit according to claim 10, wherein the memory device includes a buffer circuit with a resistor connected between an input and an output of the buffer circuit.

12. A level shift circuit according to claim 11, wherein the buffer circuit includes two inversion devices connected in series.

13. A level shift circuit according to claim 1, wherein the first resistor circuit includes a first resistor and a fifth resistor connected in series;
the second resistor circuit includes a second resistor and a sixth resistor connected in series;
the feedback circuit includes a third P-channel MOS transistor connected in parallel with the first resistor, a fourth P-channel MOS transistor connected in parallel with the second resistor, a fifth P-channel MOS transistor connected between the high-potential-side power supply potential of the secondary-side potential system and the first connection point, a sixth P-channel MOS transistor connected between the high-potential-side power supply potential of the secondary-side potential system and the second connection point, a seventh resistor having one end connected to the second connection point and a gate of the fifth P-channel MOS transistor and the other end connected to a gate of the third P-channel MOS transistor, and an eighth resistor having one end connected to the first connection point and a gate of the sixth P-channel MOS transistor and the other end connected to a gate of the fourth P-channel MOS transistor;
a non-inverting signal of the memory device is applied to the other end of the seventh resistor; and
an inversion signal of the memory device is applied to the other end of the eighth resistor.

14. A level shift circuit according to claim 13, wherein the transmission circuit is configured to provide high impedance for an output thereof when the first and second inputs of the transmission circuit turn on the first and second switching devices concurrently or become in the same state as the on-state.

15. A level shift circuit according to claim 14, wherein the transmission circuit includes an inversion device, a P-channel MOS transistor series circuit having first and second P-channel MOS transistors connected in series, and an N-channel MOS transistor series circuit having first and second N-channel MOS transistors connected in series;
the P-channel MOS transistor series circuit and the N-channel MOS transistor series circuit are connected in series between the high-potential-side power supply potential and the low-potential-side power supply potential in the secondary-side potential system;
the first connection point is connected to gates of the first P-channel MOS transistor and the first N-channel MOS transistor;
the second connection point is connected to an input terminal of the inversion device;
an output terminal of the inversion device is connected to gates of the second P-channel MOS transistor and the second N-channel MOS transistor; and
a connection point between the P-channel MOS transistor series circuit and the N-channel MOS transistor series circuit is connected to a data input terminal of the memory device.

16. A level shift circuit according to claim 15, wherein the memory device includes a buffer circuit with a resistor connected between an input and an output of the buffer circuit.

17. A level shift circuit according to claim 16, wherein the buffer circuit includes two inversion devices connected in series.

18. A level shift circuit according to claim 1, wherein the first resistor circuit includes a first resistor;
the second resistor circuit includes a second resistor;
the feedback circuit includes a first series resistor circuit which includes a ninth resistor and a tenth resistor connected in series, and a second series resistor circuit which includes an eleventh resistor and a twelfth resistor connected in series;
one end of the first series resistor circuit is connected to the first connection point;
one end of the second series resistor circuit is connected to the second connection point;
a connection point between the ninth resistor and the tenth resistor is connected to a gate of a fourth P-channel MOS transistor;
a connection point between the eleventh resistor and the twelfth resistor is connected to a gate of a third P-channel MOS transistor;
an inversion signal of the memory device is applied to the other end of the first series resistor circuit; and
a non-inverting signal of the memory device is applied to the other end of the second series resistor circuit.

19. A level shift circuit according to claim 18, wherein the transmission circuit is configured to provide high impedance for an output thereof when the first and second inputs of the transmission circuit turn on the first and second switching devices concurrently or become in the same state as the on-state.

20. A level shift circuit according to claim 19, wherein the transmission circuit includes an inversion device, a P-channel MOS transistor series circuit having first and second P-channel MOS transistors connected in series, and an N-channel MOS transistor series circuit having first and second N-channel MOS transistors connected in series;
the P-channel MOS transistor series circuit and the N-channel MOS transistor series circuit are connected in series between the high-potential-side power supply potential and the low-potential-side power supply potential in the secondary-side potential system;
the first connection point is connected to gates of the first P-channel MOS transistor and the first N-channel MOS transistor;
the second connection point is connected to an input terminal of the inversion device;
an output terminal of the inversion device is connected to gates of the second P-channel MOS transistor and the second N-channel MOS transistor; and
a connection point between the P-channel MOS transistor series circuit and the N-channel MOS transistor series circuit is connected to a data input terminal of the memory device.

21. A level shift circuit according to claim 20, wherein the memory device includes a buffer circuit with a resistor connected between an input and an output of the buffer circuit.

22. A level shift circuit according to claim 21, wherein the buffer circuit includes two inversion devices connected in series.

* * * * *

UNITED STATES PATENT AND TRADEMARK OFFICE
CERTIFICATE OF CORRECTION

PATENT NO. : 8,351,235 B2
APPLICATION NO. : 12/926500
DATED : January 8, 2013
INVENTOR(S) : Masashi Akahane It is certified that error appears in the above-identified patent and that said Letters Patent is hereby corrected as shown below:

On the Title page, Item (57), In ABSTRACT,
Please change line 7, "dealt with out" to --dealt with without--.

In SPECIFICATION,
Please change column 8, line 22, "points;up to" to --points up to--.

Please change column 20, line 45, "MP3 and M94" to --MP3 and MP4--.

Please change column 21, line 7, "0.45kΩ." to --45Ω.--.

Please change column 21, line 7, "E1·Ra/(Ra₊Rb)" to --E1·Ra/(Ra+Rb)--.

Please change column 21, line 35, "(RaRb₊RbRon₊RonRa)" to --(RaRb+RaRon+RonRa)--.

Signed and Sealed this
Twenty-third Day of July, 2013

Teresa Stanek Rea
*Acting Director of the United States Patent and Trademark Office*